United States Patent
Yoshimura et al.

(10) Patent No.: US 8,674,392 B2
(45) Date of Patent: Mar. 18, 2014

(54) LIGHT-EMITTING DEVICE

(75) Inventors: Kenichi Yoshimura, Osaka (JP); Hiroshi Fukunaga, Osaka (JP); Kohsei Takahashi, Osaka (JP); Naoto Hirosaki, Tsukuba (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 13/580,791

(22) PCT Filed: Jan. 27, 2011

(86) PCT No.: PCT/JP2011/051600
§ 371 (c)(1),
(2), (4) Date: Aug. 23, 2012

(87) PCT Pub. No.: WO2011/105157
PCT Pub. Date: Sep. 1, 2011

(65) Prior Publication Data
US 2012/0319155 A1      Dec. 20, 2012

(30) Foreign Application Priority Data

Feb. 26, 2010 (JP) ................................. 2010-043107

(51) Int. Cl.
*H01L 33/00* (2010.01)
(52) U.S. Cl.
USPC .......................................................... 257/98
(58) Field of Classification Search
USPC .......................................................... 257/98
See application file for complete search history.

(56) References Cited

U.S. PATENT DOCUMENTS

2004/0135504 A1    7/2004  Tamaki et al.
2006/0038477 A1    2/2006  Tamaki et al.
(Continued)

FOREIGN PATENT DOCUMENTS

| JP | 2003-321675 | 11/2003 |
|---|---|---|
| JP | 2005-255895 | 9/2005 |

(Continued)

OTHER PUBLICATIONS

International Search Report mailed Oct. 25, 2011, directed to International Application No. PCT/JP2011/066226; 1 page.

(Continued)

*Primary Examiner* — Julio J Maldonado
*Assistant Examiner* — Hajar Kolahdouzan
(74) *Attorney, Agent, or Firm* — Morrison & Foerster LLP

(57) ABSTRACT

Disclosed is a light-emitting device that exhibits good color rendering and highly efficiently emits white light in an incandescent bulb color range. The semiconductor light-emitting device (1) of the present invention includes: a semiconductor light-emitting element (2) that emits blue light; a green phosphor (14) that absorbs the blue light and emits green light; and an orange phosphor (13) that absorbs the blue light and emits orange light. The orange phosphor (13) produces an emission spectrum having a peak at a wavelength of equal to or greater than 590 nm but equal to or less than 630 nm and having a full width at half maximum of 130 nm or greater at the peak, the full width at half maximum of the emission spectrum of the orange phosphor (13) being broader than a full width at half maximum of an emission spectrum of the green phosphor (14). The orange phosphor (13) exhibits an absorptance having a peak wavelength of 420 nm or greater. ABS(530) and ABS(MAX) satisfy a relation, ABS(530)/ABS(MAX)<0.60, where ABS(MAX) is an absorptance of the orange phosphor (13) at the peak wavelength thereof, and ABS(530) is an absorptance of the orange phosphor (13) at a wavelength of 530 nm.

10 Claims, 18 Drawing Sheets

(56) References Cited

U.S. PATENT DOCUMENTS

| | | | |
|---|---|---|---|
| 2007/0007494 A1 | 1/2007 | Hirosaki et al. | |
| 2007/0108896 A1 | 5/2007 | Hirosaki | |
| 2007/0194695 A1 | 8/2007 | Yoon et al. | |
| 2008/0089825 A1 | 4/2008 | Tamaki et al. | |
| 2008/0197321 A1 | 8/2008 | Hirosaki et al. | |
| 2008/0258602 A1 | 10/2008 | Masuda et al. | |
| 2008/0297031 A1* | 12/2008 | Takahashi et al. | 313/503 |
| 2009/0033201 A1 | 2/2009 | Shimooka et al. | |
| 2009/0057707 A1 | 3/2009 | Katsuno et al. | |
| 2009/0066230 A1* | 3/2009 | Hirosaki et al. | 313/504 |
| 2009/0072708 A1 | 3/2009 | Tamaki et al. | |
| 2009/0079327 A1 | 3/2009 | Daicho et al. | |
| 2009/0129052 A1 | 5/2009 | Hirosaki | |
| 2009/0153028 A1 | 6/2009 | Hirosaki | |
| 2009/0166584 A1 | 7/2009 | Shimooka et al. | |
| 2009/0230840 A1 | 9/2009 | Tamaki et al. | |
| 2009/0284132 A1 | 11/2009 | Tamaki et al. | |
| 2009/0309485 A1 | 12/2009 | Tamaki et al. | |
| 2010/0053932 A1 | 3/2010 | Emoto et al. | |
| 2010/0133563 A1 | 6/2010 | Schmidt et al. | |
| 2011/0007228 A1 | 1/2011 | Yoon et al. | |
| 2011/0248303 A1* | 10/2011 | Suzuki et al. | 257/98 |
| 2012/0019127 A1 | 1/2012 | Hirosaki | |
| 2012/0104448 A1 | 5/2012 | Yoshimura et al. | |
| 2012/0262648 A1 | 10/2012 | Hirosaki et al. | |

FOREIGN PATENT DOCUMENTS

| | | |
|---|---|---|
| JP | 2006-8721 | 1/2006 |
| JP | 2006-206729 | 8/2006 |
| JP | 2007-134606 | 5/2007 |
| JP | 2007-180483 | 7/2007 |
| JP | 2007-227928 | 9/2007 |
| JP | 2007-231245 | 9/2007 |
| JP | 2008-127509 | 6/2008 |
| JP | 2008-127547 | 6/2008 |
| JP | 2008-138156 | 6/2008 |
| JP | 2008-530334 | 8/2008 |
| JP | 2008-244468 | 10/2008 |
| JP | 2008-250254 | 10/2008 |
| JP | 2008-303331 | 12/2008 |
| JP | 2009-49267 | 3/2009 |
| JP | 2009-73914 | 4/2009 |
| JP | 3150457 U | 4/2009 |
| WO | WO-2006/126567 | 11/2006 |
| WO | WO-2008/062781 | 5/2008 |
| WO | WO-2010/110457 | 9/2010 |
| WO | WO-2011/002087 | 1/2011 |

OTHER PUBLICATIONS

International Search Report mailed Oct. 25, 2011, directed to International Application No. PCT/JP2011/066230; 1 page.

Xie, R-J. et al. (2007). "Silicon-based Oxynitride and Nitride Phosphors for White LEDs-A review." *Science and Technology of Advanced Materials*. 8:588-600.

Search Report dated Aug. 3, 2010, directed to International Application No. PCT/JP2010/061345; 2 pages.

Search Report dated Mar. 1, 2011, directed to International Application No. PCT/JP2011/051600; 2 pages.

Yoshimura et al., U.S. Office Action mailed Nov. 15, 2013, directed to U.S. Appl. No. 13/381,348; 11 pages.

\* cited by examiner

F I G. 1 6
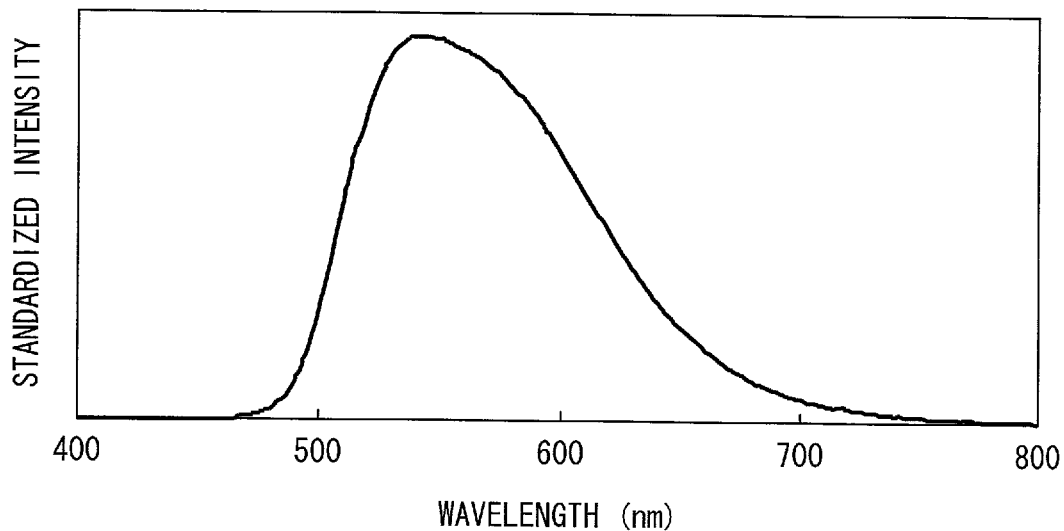
F I G. 1 7
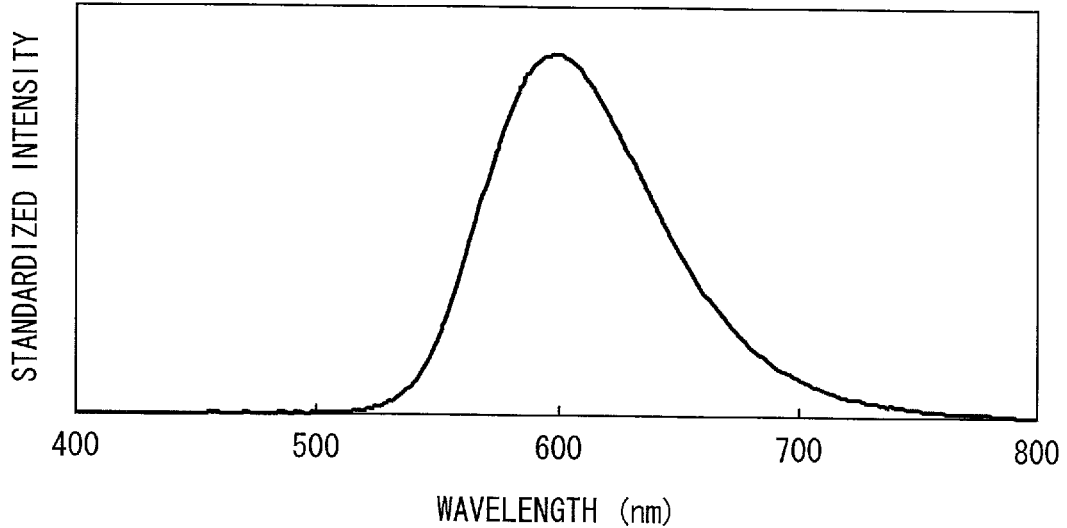

EXAMPLE 1

EXAMPLE 2

EXAMPLE 3

EXAMPLE 4

EXAMPLE 5

EXAMPLE 6

EXAMPLE 7

EXAMPLE 8

EXAMPLE 9

EXAMPLE 10

COMPARATIVE EXAMPLE 1

COMPARATIVE EXAMPLE 2

F I G. 3 0
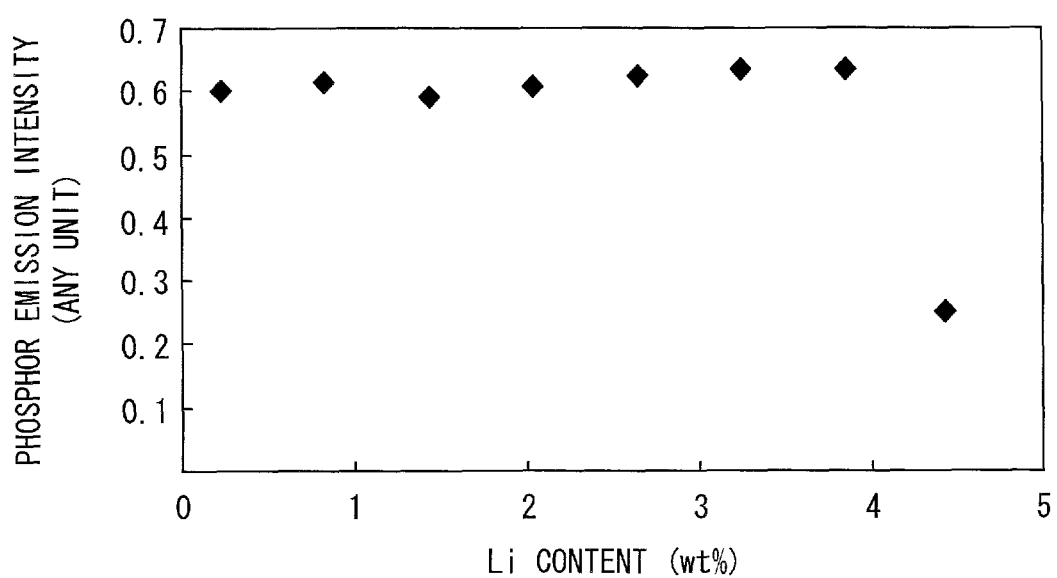

US 8,674,392 B2

LIGHT-EMITTING DEVICE

REFERENCE TO RELATED APPLICATIONS

This application is a national stage application under 35 USC 371 of International Application No. PCT/JP2011/051600, filed Jan. 27, 2011, which claims priority from Japanese Patent Application No. 2010-043107 filed Feb. 26, 2010, the entire contents of which are incorporated herein by reference.

FIELD OF THE INVENTION

The present invention relates to a light-emitting device including a phosphor.

BACKGROUND OF THE INVENTION

Light-emitting diodes (LEDs) and like semiconductor light-emitting elements have advantages of being compact, low power consuming, and being capable of stable, high-luminance light emission. Lighting fixtures that use light-emitting devices provided with white-light-emitting LEDs have progressively replaced incandescent lamps and other lighting fixtures. Examples of the white-light-emitting LED include combinations of blue LEDs and YAG phosphor (composition being $(Y,Gd)_3(Al,Ga)_5O_{12}$).

The light-emitting device thus configured produces white light by mixing the blue light from the LED with the yellow light emitted from the YAG phosphor. The configuration is short on emission of red light due to the light-emitting properties of the YAG phosphor, and thus is not ideal for emission of warm white light that resembles the incandescent bulb color, which warm white light is in the need for home lighting fixtures and other applications.

Disclosed in view of these issues is a light-emitting device capable of emitting reddish warm white light by combining a blue LED, YAG phosphor, and an additional nitride-based red phosphor (see, for example, Patent Literature 1).

A light-emitting device, configured as exemplified in Patent Literature 1, allows for emitting white light that exhibits a large value for a color rendering index (Ra) at color temperatures in the incandescent bulb color range, of 3,250 K or lower, and especially can emit white light exhibiting an excellent value for a special color rendering index (R9), which R9 is a measure of how red is rendered.

However, according to the configuration, the red phosphor absorbs fluorescent light emitted by the YAG phosphor. In this manner, a large proportion of light emitted by one phosphor is absorbed by another phosphor (mutual light absorption of phosphors), thereby greatly reducing light emission efficiency of the light-emitting device.

Under these circumstances, a configuration is disclosed which holds down mutual light absorption of phosphors (see, for example, Patent Literature 2). The configuration includes a blue LED, a green phosphor, and a yellow thru/or a red phosphor. The green phosphor emits light with a peak wavelength in a range from at least 500 nm to less than 540 nm. The yellow thru/or a red phosphor emits light having a peak wavelength in a range from 575 nm to 650 nm and also having, at a wavelength of 520 nm of the excitation spectrum, an intensity equal to or less than 60% of the intensity at the peak wavelength of the excitation spectrum.

Japanese Patent Application Publication, Tokukai, No. 2003-321675A (Published Nov. 14, 2003)

Japanese Patent Application Publication, Tokukai, No. 2008-244468A (Published Oct. 9, 2008)

SUMMARY OF THE INVENTION

There is a demand, however, for a light-emitting device that is capable of more efficiently emitting white light in the incandescent bulb color range than the configuration described in Patent Literature 2, without degrading the color rendering.

In view of these issues, it is an object of the present invention to achieve a light-emitting device that exhibits good color rendering and emits white light in the incandescent bulb color range, highly efficiently.

The inventors of the present invention carried out diligent study to address the issues and made various experimental light-emitting devices using phosphors and semiconductor light-emitting elements. The inventors consequently found that, according to the configuration exemplified in Patent Literature 2 in which mutual light absorption of phosphors is further held down by a combination of a green phosphor and a yellow thru/or a red phosphor, if the green phosphor produces an emission spectrum with a FWHM (full width at half maximum) being narrower than the FWHM of the emission spectrum of the yellow thru/or the red phosphor, and the FWHM of the emission spectrum of the yellow thru/or the red phosphor is equal to or greater than a predetermined value, mutual light absorption of phosphors is better held down, thereby improving Ra and R9.

The inventors thus found that it is possible to address the issues by combining an orange phosphor that has a predetermined peak wavelength and exhibits a FWHM for that peak, with a green phosphor that exhibits a FWHM for a predetermined peak and a blue LED. This led to the completion of the invention.

It is common technical knowledge that in order to improve color rendering in a configuration of a light-emitting device in which a phosphor and a semiconductor light-emitting element are used, a phosphor that exhibits a broader FWHM in its emission spectrum should be used. Contrary to that common technical knowledge, however, the inventors of the present invention found that in a case in which a light-emitting device that emits incandescent bulb color light is configured from a combination of a green phosphor and an orange phosphor having an emission spectrum with a broad FWHM, a light-emitting device which exhibits good color rendering and emits white light in the incandescent bulb color range with high efficiency is achieved by using a green phosphor that has a narrow FWHM. The present invention is thus contrary to the conventional common technical knowledge and cannot be readily conceived by a person skilled in the art.

Patent Literature 2, for example, describes a green phosphor that has a FWHM of about 65 nm to 120 nm in its emission spectrum and a yellow thru/or a red phosphor that has a FWHM of 4 nm to 120 nm in its emission spectrum. A comparison of the FWHM of the green phosphor and the FWHM of the yellow thru/or the red phosphor shows that the former is almost equal to or broader than the latter (see paragraphs [0015], [0016] to [0017] of Patent Literature 2).

Specifically, to attain the object, a semiconductor light-emitting device in accordance with the present invention is a semiconductor light-emitting device that emits white light in an incandescent bulb color range, including: a semiconductor light-emitting element that emits blue light; a green phosphor that absorbs the blue light and emits green light; and an orange phosphor that absorbs the blue light and emits orange light, the orange phosphor producing an emission spectrum having a peak at a wavelength of equal to or greater than 590 nm but equal to or less than 630 nm, and having a full width at half maximum of 130 nm or greater at the peak, the full width at half maximum of the emission spectrum of the orange phosphor being broader than a full width at half maximum of an emission spectrum of the green phosphor, the orange phosphor exhibiting an absorptance having a peak wavelength of 420 nm or greater, ABS(530) and ABS(MAX) satisfying the following relation: ABS(530)/ABS(MAX) <0.60, where ABS(MAX) is an absorptance of the orange phosphor at the peak wavelength of the absorptance, and ABS(530) is an absorptance of the orange phosphor at a wavelength of 530 nm.

The foregoing configuration brings about an advantage of providing a light-emitting device that exhibits greater Ra and R9, which light-emitting device sufficiently holds down absorption of green light by use of the orange phosphor, and which efficiently emits white light in the incandescent bulb color range.

Additional objectives, advantages and novel features of the invention will be set forth in part in the description which follows, and in part will become apparent to those skilled in the art upon examination of the following or may be learned by practice of the invention.

A semiconductor light-emitting device in accordance with the present invention, as described above, is configured so that: the orange phosphor produces an emission spectrum having a peak at a wavelength of equal to or greater than 590 nm but equal to or less than 630 nm, and having a full width at half maximum of 130 nm or greater at the peak, the full width at half maximum of the emission spectrum of the orange phosphor being broader than a full width at half maximum of an emission spectrum of the green phosphor, the orange phosphor exhibiting an absorptance having a peak wavelength of 420 nm or greater, ABS(530) and ABS(MAX) satisfying the following relation:

$$ABS(530)/ABS(MAX)<0.60,$$

where ABS(MAX) is an absorptance of the orange phosphor at the peak wavelength of the absorptance, and ABS(530) is an absorptance of the orange phosphor at a wavelength of 530 nm.

The configuration brings about an advantage of providing a semiconductor light-emitting device which exhibits high Ra and R9 and which efficiently emits white light in the incandescent bulb color range.

BRIEF DESCRIPTION OF THE DRAWINGS

FIG. 16 is a graph representing an emission spectrum of phosphor powder obtained in Production Example 2-4.

FIG. 17 is a graph representing an emission spectrum of phosphor powder obtained in Comparative Production Example 1.

FIG. 30 is a graph representing a Li concentration dependency of emission intensity of a solid solution crystal that incorporates Ce and oxygen.

DETAILED DESCRIPTION OF THE INVENTION

The following describes an embodiment of the present invention. Note that throughout the present specification, the expression "A to B," which indicates a range of numerical values, should be interpreted to mean equal to or greater than A but equal to or less than B. In addition, various physical properties described in the present specification are measured by methods described in the examples of the invention (which are described later in detail) unless otherwise specified.

Figure 1:
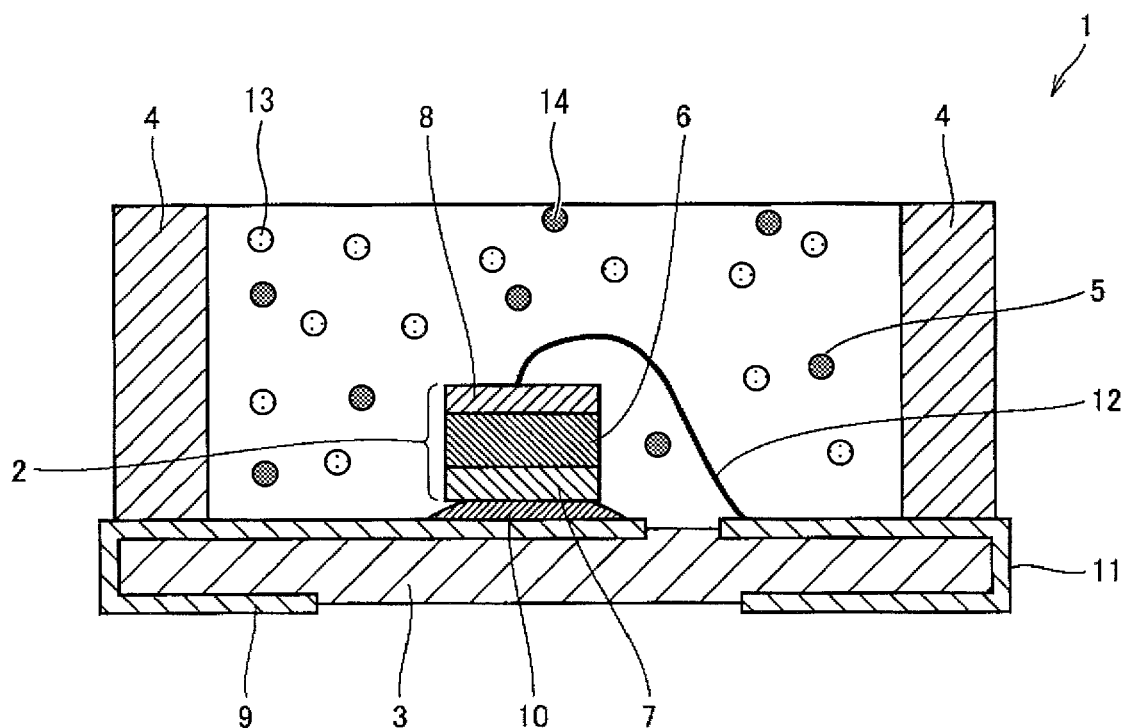
FIG. 1 is a cross-sectional view illustrating a schematic configuration of a semiconductor device in accordance with the present embodiment.

FIG. 1 is a cross-sectional view schematically illustrating a configuration of a semiconductor device in accordance with the present embodiment.

A semiconductor light-emitting device 1 in accordance with the present embodiment is a semiconductor light-emitting device 1 that emits white light in an incandescent bulb color range. The semiconductor light-emitting device 1 includes: a semiconductor light-emitting element 2 that emits blue light; an orange phosphor 13 that absorbs the blue light and emits orange light; and a green phosphor 14 that absorbs the blue light and emits green light.

The orange phosphor 13 produces an emission spectrum having a peak at a wavelength of equal to or greater than 590 nm but equal to or less than 630 nm and also having a FWHM (full width at half maximum) of 130 nm or greater at the peak. In addition, the orange phosphor 13 exhibits an absorptance having a peak wavelength of 420 nm or greater. Letting ABS (MAX) represent an absorptance of the orange phosphor at the peak wavelength of the absorptance, and ABS(530) represent an absorptance of the orange phosphor at a wavelength of 530 nm, ABS(530) and ABS(MAX) satisfy the following relation:

$$ABS(530)/ABS(MAX) < 0.60.$$

Patent Literature 2 exemplifies a configuration of a combination of a blue LED, a green phosphor, and a yellow thru/or a red phosphor, in which the absorption of green light is held down by the phosphor (although represented as yellow thru/or red phosphor in Patent Literature 2, this may be referred to as an "orange phosphor" in the following description for convenience) that emits light at wavelengths longer than that of the green phosphor, similarly to the present invention. This configuration, however, differs vastly from the configuration in accordance with the present invention in the following two respects:

(1) The configuration in accordance with Patent Literature 2 does not specify a range of a peak wavelength for an excitation (absorption) spectrum of the orange phosphor.

(2) Patent Literature 2 specifies an excitation rate (absorptance) at a wavelength of 520 nm with respect to a maximum of an excitation (absorption) spectrum, whereas the configuration in accordance with the present invention specifies an excitation rate (absorptance) at a wavelength of 530 nm with respect to a maximum of an excitation (absorption) spectrum.

In connection with (1), it follows that the configuration in accordance with Patent Literature 2 encompasses a configuration in which a phosphor is used that exhibits an excitation (absorption) peak at 350 nm and an excitation (absorption) efficiency gently decreases until reaching the green light wavelength region (see Example 3 of Patent Literature 2). According to this particular configuration, even if excitation (absorption) intensities in the green light region are relatively low when compared with the excitation (absorption) intensity at an excitation peak wavelength, excitation (absorption) intensities in the blue light region (the actual excitation light) have similar values to the excitation (absorption) intensities in the green light region. Hence, efficient absorption of excitation light will result in a high percentage of green light being absorbed.

In contrast, the orange phosphor in accordance with the present invention is free from such a problem because it has a peak wavelength of 420 nm or greater in its excitation (absorption) spectrum.

In connection with (2), the configuration in accordance with the present invention specifies the FWHM of the emission spectrum of the orange phosphor as 130 nm or greater, and specifies that the FWHM of the emission spectrum of the green phosphor as being narrower than the FWHM of the emission spectrum of the orange phosphor. Accordingly, the absorption of green light by the orange phosphor is further held down than that of the configuration in accordance with Patent Literature 2. Hence, even if the excitation (absorption) spectrum of the orange phosphor is located at longer wavelengths in the present invention than that in Patent Literature 2, the absorption of green light is sufficiently held down. As a result, it is possible to fabricate a light-emitting device that exhibits high color rendering and which highly efficiently emits white light in the incandescent bulb color range.

Note that in the present specification, "blue light" refers to light having a peak wavelength of 420 nm to 480 nm in its emission spectrum, "green light" refers to light having a peak wavelength of 500 nm to 550 nm in its emission spectrum, and "orange light" refers to light having a peak wavelength of 570 nm to 630 nm in its emission spectrum. In addition, a "green phosphor" is a substance which emits green light by being excited by blue light, and an "orange phosphor" refers to a substance which emits orange light.

The semiconductor light-emitting device 1 in accordance with the present embodiment has the semiconductor light-emitting element 2 disposed on a printed wiring board 3 that serves as a substrate. A resin casing 4, similarly disposed on the printed wiring board 3, is filled with a mold resin 5 so as to seal the semiconductor light-emitting element 2. The mold resin 5 is composed of a transparent resin in which the orange phosphor 13 and the green phosphor 14 are dispersed.

The semiconductor light-emitting element 2 includes an InGaN layer 6 as an active layer, and further includes a p-side electrode 7 and an n-side electrode 8 disposed in such a manner that the InGaN layer 6 is sandwiched between the p-side electrode 7 and the n-side electrode 8. The n-side electrode 8 is electrically connected to an n-electrode section 9 via an electrically conductive adhesive 10. The n-electrode section 9 is disposed along a top face to a back face of the printed wiring board 3. The p-side electrode 7 of the semiconductor light-emitting element 2 is electrically connected to a p-electrode section 11 via a metal wire 12. The p-electrode section 11 is disposed along the top face to the back face of the printed wiring board 3 separately from the n-electrode section 9.

Note that the semiconductor light-emitting device 1 in accordance with the present embodiment is by no means limited to the structure shown in FIG. 1, and a typical, publicly known conventional structure for a semiconductor light-emitting device can be employed.

Since the semiconductor light-emitting device 1 in accordance with the present embodiment is a semiconductor light-emitting device that emits white light in the incandescent bulb color range, the light emitted by the semiconductor light-emitting device 1 in accordance with the present embodiment has a peak wavelength of about 600 nm. In order to improve R9, which is a practically important indicator of how red is rendered by a lighting fixture, wavelengths of about 630 nm to 640 nm are material. From this viewpoint, it is preferred that PI(MAX) and PI(40) satisfy the following relation:

$$PI(40)/PI(MAX) > 0.70,$$

where PI(MAX) is an emission intensity at the peak wavelength and PI(40) is an emission intensity at a wavelength which is greater than the peak wavelength by 40 nm.

Figure 2:
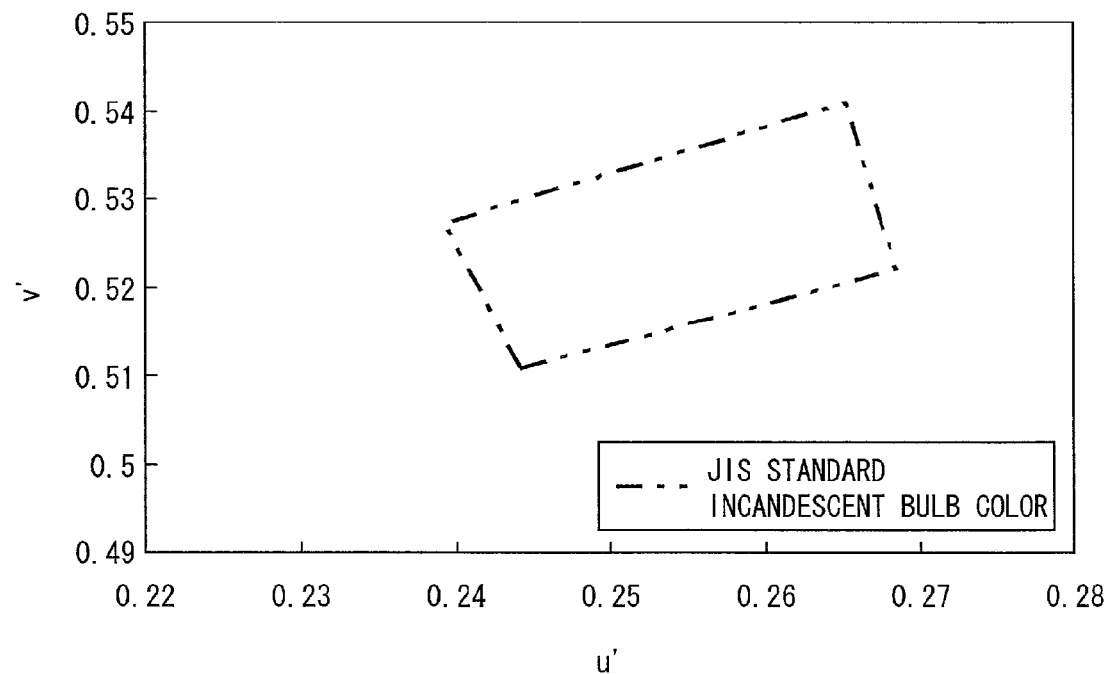
FIG. 2 is a graph representing a chromaticity point range for the incandescent bulb color, which is set forth in JIS Z9112.

Note that "white light in the incandescent bulb color range" means that the emitted light has a color temperature (TCP) in a range of 2600 K to 3250 K, and has chromaticity points within a range set forth in JIS Z9112 (see FIG. 2).

(I) Semiconductor Light-emitting Element

The semiconductor light-emitting element 2 is a light-emitting diode (LED) in the present embodiment. However, the semiconductor light-emitting element 2, by no means being limited to a light-emitting diode (LED), may be any publicly known conventional element which emits blue light, such as a semiconductor laser or an inorganic EL (electroluminescence) element. Note that the LED may be, for example, a commercial product manufactured by Cree, Inc.

An emission peak wavelength of the semiconductor light-emitting element 2, by no means being limited in any particular manner, is preferably in a range of 420 nm to 480 nm from a viewpoint of light emission efficiency. In addition, the emission peak wavelength of the semiconductor light-emitting element 2 is more preferably in a range of 440 nm to 470 nm, from a viewpoint of increased phosphor excitation efficiency and furthermore, increased Ra and R9 values. When the semiconductor light-emitting element 2 has an emission peak wavelength of 455 nm or greater, the semiconductor light-emitting element 2 exhibits an especially good color rendering capability.

(II) Orange Phosphor

The peak wavelength of the emission spectrum of the orange phosphor 13 is equal to or greater than 590 nm but equal to or less than 630 nm. The FWHM of that peak is 130 nm or greater. Letting ABS(MAX) be a maximum of the absorptance of the orange phosphor at a wavelength greater than 420 nm, and ABS(530) be the absorptance of the orange phosphor at a wavelength of 530 nm, ABS(MAX) and ABS(530) satisfy the following relation:

$$ABS(530)/ABS(MAX)<0.60.$$

By having the peak wavelength of the emission spectrum and the FWHM of the peak in the foregoing ranges, it is possible to fabricate a semiconductor light-emitting device which exhibits even better color rendering in a case in which the semiconductor light-emitting element 2 and the green phosphor 14 are used together for color mixture to obtain the incandescent bulb color light. In addition, by having the absorptance of the orange phosphor 13 satisfy the conditions above, it is possible to fabricate a light-emitting device having a higher light emission efficiency because the orange phosphor 13 sufficiently holds down the absorption of green light.

The upper limit of the FWHM of the emission spectrum of the orange phosphor 13, by no means being limited in any particular manner, is preferably 160 nm or less, more preferably 150 nm or less.

The orange phosphor 13 preferably possesses an excitation peak of its excitation spectrum at 440 nm to 470 nm. By having the excitation spectrum of the orange phosphor 13 satisfy this requirement, it is possible to fabricate a light-emitting device with high light emission efficiency.

The orange phosphor 13 is by no means limited in any particular manner, provided that it is an orange phosphor that produces an emission spectrum with the abovementioned peak wavelength and FWHM. The orange phosphor 13 is preferably a Ce-activated phosphor that is activated by Ce. This is because the Ce-activated phosphor exhibits a broad emission spectrum due to its large spin-orbit splitting of the ground state.

Specific examples of the Ce-activated phosphor that may be preferably used include Ce-activated nitride phosphors and Ce-activated oxynitride phosphors. Nitride phosphors and oxynitride phosphors are made from host material which has a strong covalent bonding, in comparison with, for example, the host materials of oxide phosphors and sulfide phosphors. For this reason, the host materials of the nitride phosphors and oxynitride phosphors are highly stable, and exhibit relatively high emission intensity even in an elevated temperature environment.

In addition, the orange phosphor 13 is preferably, among the Ce-activated nitride phosphors and the Ce-activated oxynitride phosphors, a phosphor including a Ce-containing crystalline phase, which phosphor has a chemical composition represented by the following general formula (1):

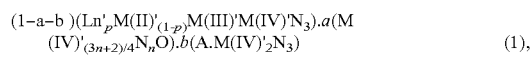
$$(1-a-b)(Ln'_p M(II)'_{(1-p)} M(III)' M(IV)' N_3) \cdot a(M(IV)'_{(3n+2)/4} N_n O) \cdot b(A.M(IV)'_2 N_3) \qquad (1),$$

where Ln' is at least one metal element selected from the group consisting of lanthanoids, Mn, and Ti;

M(II)' is one element or two or more elements selected from the group consisting of bivalent metal elements excluding the Ln' element;

M(III)' is one element or two or more elements selected from the group consisting of trivalent metal elements;

M(IV)' is one element or two or more elements selected from the group consisting of tetravalent metal elements;

A is one or more monovalent metal elements selected from the group consisting of Li, Na, and K; p is a number that satisfies the inequality if $0 \le p \le 0.2$;

a, b, and n are numbers that satisfy the inequalities of $0 \le a$, $0 \le b$, $a+b>0$, $0 \le n$, and $0.002 \le (3n+2)a/4 \le 0.9$.

The compound which has a composition represented by formula (1) can be obtained by, for example, (i) mixing nitrides or oxides of constituent metal elements in such a ratio as to achieve a desired composition ratio and (ii) baking the mixture.

An exemplary composition represented by formula (1) is Ce-activated CaAlSiN$_3$, which emits orange light, and can be produced by a method described in Japanese Patent No. 3837588. The CaAlSiN$_3$ phase described in Japanese Patent No. 3837588, when used as a host material of a phosphor, contains those sites where Si (metal element) forms coordinate bonding to Ce and those sites where Al (metal element) forms coordinate bonding to Ce in a random manner, and achieves a broader emission spectrum than the emission spectra of phosphors obtained from other host materials activated by Ce.

Other exemplary compositions are:

$$(1-a)(Ce_p Ca_{1-p} AlSiN_3) \cdot a Si_2 N_2 O \qquad (2)$$

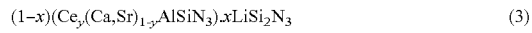
$$(1-x)(Ce_y (Ca,Sr)_{1-y} AlSiN_3) \cdot x LiSi_2 N_3 \qquad (3)$$

These compounds can be produced by a method described in Japanese Patent Application Publication, Tokukai, No. 2007-231245A.

In formula (2), p is such that $0<p\le0.2$, and preferably $0.005<p\le0.1$; and a is such that $0\le a\le0.45$, preferably $0\le a\le0.3$, more preferably $0.002\le a\le0.3$, and even more preferably $0.15\le a\le0.3$.

In addition, in formula (3), y is such that $0<y\le0.2$, preferably $0.003<y\le0.2$; and x is such that $0<x<1.0$, preferably $0.02\le x\le0.4$, and more preferably $0.03\le x\le0.35$.

From a viewpoint of orange light emission, the crystals of the host material of the Ce-activated phosphor preferably contain oxygen and Li therein. In this case, the crystals of the host material may contain therein either or both of oxygen or Li, more preferably containing both. When the Ce-activated phosphor contains either of oxygen or Li or both of oxygen and Li, the emission spectrum, absorptance, and excitation spectrum satisfy the abovementioned requirements. Thus, the Ce-activated CaAlSiN$_3$ phosphor has high light emission efficiency.

When the Ce-activated phosphor is a solid solution crystal prepared by incorporating Ce and oxygen into a crystal of $$c\text{CaAlSiN}_3 \cdot (1-c)\text{LiSi}_2\text{N}_3 \quad (4)$$

where $0.2 \leq c \leq 0.8$,
it is especially preferable to use the Ce-activated phosphor to fabricate, in combination with a green phosphor, a light-emitting device which emits white light in the incandescent bulb color range. This is because such a Ce-activated phosphor produces an emission spectrum having a peak at a longer wavelength and a broader FWHM, holds down the absorption of green light, and has especially high orange light emission efficiency.

To prepare the Ce-activated phosphor in a form of solid solution crystal that incorporates Ce and oxygen into a crystal of the above composition, a starting powder needs to contain at least one oxide, such as CeO$_2$, of a constituent metal element.

Li content in the solid solution crystal that incorporates Ce and oxygen is preferably 4% by weight or less from a viewpoint of light emission efficiency.

In addition, in a case where the semiconductor light-emitting element is used in a lighting fixture, etc., the semiconductor light-emitting element needs large electric current as compared to a case in which the semiconductor light-emitting element is used in an indicator, etc., and the semiconductor light-emitting element can have ambient temperature as high as 100° C. to 150° C. For example, in an elevated temperature environment where ambient temperature can reach as high as 150° C., the emission intensity of a YAG:Ce phosphor given as an example in Japanese Patent Application Publication, Tokukai, No. 2003-321675A drops to 50% of that at room temperature, as disclosed in Japanese Patent Application Publication, Tokukai, No. 2008-127529A. The oxynitride phosphor described in the specification of the present application has excellent light-emitting properties, especially, in an elevated temperature environment when compared with such conventional phosphors. The oxynitride phosphor described in the specification of the present application can maintain an emission intensity as high as 85% to 90% of that at room temperature even in an elevated temperature environment where the ambient temperature is 100° C. to 150° C., as given as an example in, for example, Non-patent Literature (Science and Technology of Advanced Materials, 8 (2007) 588-600).

The phosphor included in the semiconductor light-emitting device in accordance with the present embodiment preferably has high-temperature light-emitting properties that are equivalent to those of the phosphor given as an example in the Non-patent Literature. From this viewpoint, Ce content in the solid solution crystal that incorporates Ce and oxygen is preferably more than 0% by weight but equal to or less than 6% by weight.

Furthermore, the Li content in the solid solution crystal that incorporates Ce and oxygen is preferably equal to or greater than 1.5% by weight from a viewpoint of broader emission spectrum FWHM. The broader FWHM the emission spectrum of the orange phosphor 13 is, the better color rendering and the higher light emission efficiency the semiconductor light-emitting device in accordance with the present embodiment exhibits.

The orange phosphor 13 preferably has a particle size of 1 μm to 50 μm, more preferably 5 μm to 20 μm. In addition, regarding particle structure, the orange phosphor 13 is preferably individual particles rather than an aggregate, and specifically has a specific surface area of, preferably, 1 g/m$^2$ or less, and more preferably 0.4 g/m$^2$ or less. These particle size and structures can be achieved by use of suitable technology, such as mechanical pulverization, grain boundary phase removal by acid treatment, and annealing.

Note that a semiconductor light-emitting device including a combination of a Ce-activated CaAlSiN$_3$ phosphor and a green phosphor is disclosed also in Japanese Patent Application Publication, Tokukai, No. 2008-530334A, which shows, in FIG. 2, an excitation spectrum of the Ce-activated CaAlSiN$_3$ phosphor as an example. The configuration in accordance with the present invention, however, differs from the invention described in Japanese Patent Application Publication, Tokukai, No. 2008-530334A.

Specifically, the Ce-activated CaAlSiN$_3$ phosphor (orange phosphor) disclosed in Japanese Patent Application Publication, Tokukai, No. 2008-530334A has a higher excitation efficiency in the green light region (in other words, does not satisfy ABS(530)/ABS(MAX)<0.60) than the Ce-activated CaAlSiN$_3$ phosphor given as an example in the present specification. Therefore, the Ce-activated CaAlSiN$_3$ phosphor disclosed in Japanese Patent Application Publication, Tokukai, No. 2008-530334A, when incorporated in a light-emitting device, increases mutual light absorption of phosphors and substantially reduces the light emission efficiency of the light-emitting device.

In contrast, the configuration in accordance with the present invention includes an orange phosphor that has optimal light-emitting and absorbing properties when used in a combination of a blue LED, a green phosphor, and the orange phosphor. Especially, the inventors of the present invention found that a solid solution crystal prepared by incorporating Ce and oxygen into a crystal having a composition of $c$CaAlSiN$_3$*(1−$c$)LiSi$_2$N$_3$ (where 0.2≤$c$≤0.8), is suitable as a specific Ce-activated CaAlSiN$_3$ phosphor for achieving optimal light-emitting and absorbing properties. For these reasons, it is possible to fabricate a light-emitting device which exhibits good color rendering and efficiently emits white light in the incandescent bulb color range.

(III) Green Phosphor

The FWHM of the emission spectrum of the green phosphor 14 is narrower than that of the orange phosphor 13, more preferably equal to or less than 70 nm, and even more preferably equal to or less than 55 nm. The lower limit of the FWHM of the emission spectrum of the green phosphor 14, by no means limited in any particular manner, is preferably 15 nm or more and more preferably 40 nm or more.

When the FWHM of the emission spectrum of the green phosphor 14 is in the above range, the absorption of green light by the orange phosphor 13 is held down, thereby allowing achievement of a light-emitting device with even higher light emission efficiency.

The green phosphor 14 is, by no means limited in any particular manner provided that it satisfies the requirements, may preferably be, for example, an Eu-activated oxynitride phosphor, because of its high stability and excellent temperature characteristics.

Furthermore, out of the Eu-activated oxynitride phosphors, Eu-activated BSON phosphors disclosed in Japanese Patent Application Publication, Tokukai, No. 2008-138156A and Eu-activated 13-sialon phosphor disclosed in Japanese Patent Application Publication, Tokukai, No. 2005-255895A, which has excellent light emission efficiency, are suitably used.

The Eu-activated β-sialon phosphor, among those exemplified as the green phosphor 14 in particular, has high stability and temperature properties. Moreover, the FWHM of the emission spectrum is particularly narrow, thereby demonstrating excellent light-emitting properties.

More specifically, the Eu-activated BSON phosphor preferably is a phosphor represented by the following composition:

$$Ba_{y'}Eu_{x'}Si_{u'}O_{v'}N_{w'},$$

where $0 \leq y' \leq 3$, $1.6 \leq y'+x' \leq 3$, $5 \leq u' \leq 7$, $9 < v' < 15$, $0 < w' \leq 4$, and a further preferable range of the y', x', u', v', and w' is $1.5 \leq y' \leq 3$, $2 \leq y'+x' \leq 3$, $5.5 \leq u' \leq 7$, $10 < v' < 13$, $15 < w' \leq 4$.

Moreover, it is preferable that the Eu-activated β-sialon phosphor is specifically a phosphor having the following composition:

$$Si_{6-z'}Al_{z'}O_{z'}N_{8-z'}$$

wherein $0 < z' < 4.2$, a further preferable range of the z' being $0 < z' < 0.5$.

Moreover, the Eu-activated β-sialon preferably has an oxygen content in a range of 0.1 to 0.6% by weight, and an Al content in a range of 0.13 to 0.8% by weight. By having the Eu-activated β-sialon phosphor be in the foregoing ranges, the emission spectrum FWHM tends to be narrow.

The Eu-activated β-sialon phosphor disclosed in International publication WO2008/062781 is one in which a damage phase of the phosphor is removed by post-treatment such as acid treatment and the like after the baking. Hence, few unnecessary absorption occurs, thereby having high light emission efficiency. Furthermore, the Eu-activated β-sialon phosphor exemplified in Japanese Patent Application Publication, Tokukai, No. 2008-303331A has an oxygen content of 0.1 to 0.6% by weight, which is thus preferable since the emission spectrum FWHM becomes further narrow.

More specifically, as the green phosphor 14 as described above, a phosphor may be suitably used that has a wavelength band totally not involved in the light emission of the β-sialon phosphor and whose light absorptance at 600 nm that is near a peak wavelength of the orange phosphor is 10% or less.

The green phosphor 14 preferably has a particle size of 1 μm to 50 μm, more preferably 5 μm to 20 μm. In addition, regarding particle structure, the green phosphor 14 is preferably individual particles rather than an aggregate, and specifically has a specific surface area of, preferably, 1 g/m² or less, and more preferably 0.4 g/m² or less. These particle size and structures can be achieved by use of suitable technology, such as mechanical pulverization, grain boundary phase removal by acid treatment, and annealing.

In a case in which the green phosphor 14 used in the present embodiment is an Eu-activated oxynitride phosphor and the orange phosphor 13 is a Ce-activated nitride phosphor or a Ce-activated oxynitride phosphor, both of the two kinds of phosphors are nitrogen-based. Accordingly, these two kinds of phosphors have close values of the temperature dependency, specific gravity, particle size etc.

Hence, when a semiconductor light emitting device as like one described above is fabricated, this becomes a light-emitting device that can be produced with high yield, and with high reliability that is not affected easily by the ambient environment. In addition, the nitride phosphor has strong covalent bonding in its crystals of the host material, so hence the temperature dependency is low in particular and is strong against chemical and physical damage.

(IV) Mold Resin

In the semiconductor light emitting device 1, the mold resin 5 used for sealing the semiconductor light-emitting element 2 is, for example, a transparent resin such as silicone resin, epoxy resin or the like, in which the orange phosphor 13 is dispersed therein. It is not limited in particular in its dispersion method, and a conventionally known method can be employed.

A mixed ratio of the dispersed orange phosphor 13 and green phosphor 14 is not limited in particular, and may be determined as appropriate, so that the white light in the incandescent bulb color region is emitted. For example, a weight ratio of the transparent resin to the orange phosphor 13 and the green phosphor 14 (transparent resin weight/(orange phosphor 13+green phosphor 14)) may be within a range of 2 to 20. Furthermore, the weight ratio of the green phosphor 14 to the orange phosphor 13 (weight ratio of green phosphor 14/orange phosphor 13) may be within a range of 0.05 to 1.

(V) Others

In the semiconductor light emitting device 1 according to the present embodiment, the printed wiring board 3, the adhesive 10, the metal wire 12, and the like, other than the semiconductor light-emitting element 2, the orange phosphor 13, the green phosphor 14, and the mold resin 5, can employ a configuration similar to the conventional art (e.g. Japanese Patent Application, Tokukai, No. 2003-321675A, Japanese Patent Application, Tokukai, No. 2006-8721A), and can be produced by a similar method as the conventional art.

The present invention described above may be reworded as follows. Namely, the present invention is:

(1) A semiconductor light-emitting device including: a semiconductor light-emitting element that emits blue light; a green phosphor that absorbs the blue light and emits green light; and an orange phosphor that absorbs the blue light and emits orange light, the orange phosphor producing an emission spectrum having a peak at a wavelength of equal to or greater than 590 nm but equal to or less than 630 nm and also having a full width at half maximum of 130 nm or greater for the peak, and ABS(530) and ABS(MAX) satisfying the following relation:

$$ABS(530)/ABS(MAX) < 0.60,$$

where ABS(MAX) is a maximum absorptance of the orange phosphor at a wavelength of longer than 420 nm, and ABS(530) is an absorptance of the orange phosphor at a wavelength of 530 nm.

(2) The semiconductor light-emitting device as set forth in (1), wherein the full width at half maximum of the emission spectrum of the green phosphor is equal to or less than 70 nm.

(3) The semiconductor light-emitting device as set forth in (1), wherein the orange phosphor is a Ce-activated nitride phosphor or a Ce-activated oxynitride phosphor.

(4) The semiconductor light-emitting device as set forth in (3), wherein the Ce-activated nitride phosphor or the Ce-activated oxynitride phosphor is a Ce-activated CaAlSiN₃ phosphor including a crystalline phase having a chemical composition represented by the following general formula (1):

$$(1-a-b)(Ln'_pM(II)'_{(1-p)}M(III)'M(IV)'N_3) \cdot a(M(IV)'_{(3n+2)/4}N_nO) \cdot b(A.M(IV)'_2N_3) \quad (1)$$

wherein Ln' is at least one metal element selected from the group consisting of lanthanoid, Mn and Ti;

M(II)' is one element or two or more elements selected from the group consisting of bivalent metal elements excluding the Ln' element;

M(III)' is one element or two or more elements selected from the group consisting of trivalent metal elements;

M(IV)' is one element or two or more elements selected from the group consisting of quadrivalent metal elements;

A is one or more monovalent metal elements selected from the group consisting of Li, Na, and K; p is a number satisfying an inequality of $0<p\leq 0.2$; and a, b and n are numbers that satisfy the following inequalities: $0\leq a$, $0\leq b$, $0<a+b<1$, $0\leq n$, and $0.002\leq(3n+2)a/4\leq 0.9$, and the Ce-activated nitride phosphor or the Ce-activated oxynitride phosphor is a solid solution crystal in which Ce and oxygen are incorporated in a crystal having the following composition:

$$cCaAlSiN_3.(1-c)LiSi_2N_3$$

where $0.2\leq c\leq 0.8$.

(5) The semiconductor light-emitting device as set forth in (4), wherein the solid solution crystal contains Ce in a range of equal to or less than 6% by weight.

(6) The semiconductor light-emitting device as set forth in (2), wherein the full width at half maximum of the emission spectrum of the green phosphor is equal to or less than 55 nm.

(7) The semiconductor light emitting device as set forth in (7), wherein the green phosphor is an Eu-activated β-sialon phosphor.

(8) The semiconductor light-emitting device as set forth in (7), wherein the Eu-activated β-sialon has an oxygen content of 0.1% by weight to 0.6% by weight.

(9) The semiconductor light-emitting device as set forth in (7), wherein the Eu-activated β-sialon phosphor exhibits an absorptance at 600 nm of equal to or less than 10%.

The semiconductor light-emitting device according to the present invention is preferably configured in such a manner that the full width of a half maximum of the emission spectrum of the green phosphor is equal to or less than 70 nm.

With the configuration, it is possible to achieve a light-emitting device having high light emission efficiency, which exhibits a higher Ra and R9, and further sufficiently holds down the absorbance of green light by the orange phosphor.

It is preferable that the semiconductor light-emitting device according to the present invention is configured in such a manner that the orange phosphor is a Ce-activated nitride phosphor or a Ce-activated oxynitride phosphor.

It is preferable that the semiconductor light-emitting device according to the present invention is configured in such manner that the orange phosphor is a Ce-activated $CaAlSiN_3$ phosphor, and is a solid solution crystal in which Ce and oxygen are incorporated into a crystal that has the following composition:

$$cCaAlSiN_3.(1-c)LiSi_2N_3$$

where $0.2\leq c\leq 0.8$.

With the foregoing configuration, the light emission efficiency of the orange phosphor increases in particular, thereby allowing for fabricating a light-emitting device having higher light emission efficiency.

It is preferable in the semiconductor light-emitting device according to the present invention that solid solution crystal contains Ce in a range of equal to or less than 6% by weight.

With the configuration, it is possible to achieve a light-emitting device having high light emission efficiency and excellent temperature properties.

It is preferable in the semiconductor light-emitting device according to the present invention that the green phosphor has a full width at half maximum of the emission spectrum of equal to or less than 55 nm.

With the configuration, it is possible to achieve a light-emitting device having high light emission efficiency, which exhibits higher Ra and R9, and further is sufficiently held down in its absorbance of green light by the orange phosphor.

It is preferable in the semiconductor light-emitting device according to the present invention that the green phosphor is an Eu-activated β-sialon phosphor.

The Eu-activated β-sialon phosphor is efficiently excited by blue light and exhibits light emission that satisfies the requirements of the present invention by the excitation with the blue light.

It is preferable in the semiconductor light-emitting device according to the present invention that the Eu-activated β-sialon has an oxygen content in a range of 0.1% by weight to 0.6% by weight.

It is preferable in the semiconductor light-emitting device according to the present invention that the Eu-activated β-sialon phosphor has an absorptance at 600 nm of equal to or less than 10%.

According to the configuration, unnecessary absorption of orange light by the green phosphor is minimized, thereby improving the light emission efficiency of the light-emitting device.

The present invention is not limited to the description of the embodiments above, but may be altered by a skilled person within the scope of the claims. An embodiment based on a proper combination of technical means disclosed in different embodiments is encompassed in the technical scope of the present invention.

The following further describes the present invention in more details with use of Examples and Comparative Examples, the present invention by no means being limited in any particular manner to these examples.

[Excitation Spectrum and Emission Spectrum]

An excitation spectrum and an emission spectrum were measured by F-4500 (product name, manufactured by Hitachi Ltd.). The excitation spectrum was measured by scanning intensities of a light emission peak. Moreover, the emission spectra were measured upon excitation with light having a wavelength of 450 nm.

[Absorption Spectrum]

An absorption spectrum of phosphor powder was measured with use of a measuring system that combines a spectrophotometer (product name: MCPD-7000, manufactured by Otsuka Electronics, Co., Ltd.) with an integrating sphere.

[Li Content and Ce Content of Phosphor Powder]

Li content and Ce content of the phosphor powder were measured by ICP (product name: IRIS Advantage, manufactured by Nippon Jarrell-Ash Co., Ltd.).

[Powder X-ray Diffraction Measurement]

Powder X-ray diffraction (XRD) was measured with use of Kα rays of Cu.

Preparation of Phosphor

Production Example 1-1

Preparation 1 of Orange Phosphor

A phosphor was synthesized by having a crystal composed of $0.3CaAlSiN_3.0.7LiSi_2N_3$ serve as a crystal of a host material, and activating this with Ce.

More specifically, to obtain a compound having a theoretical composition formula of $Ce_{0.0033}Li_{0.1157}Ca_{0.0496}Al_{0.0496}Si_{0.28}O_{00.0050}N0.4959$, starting powder was weighed so that a whole amount was 2 g with a composition ratio of $Si_3N_4$: 67.3% by weight, AlN: 10.4% by weight, $Li_3N$: 6.9% by weight, $Ca_3N_2$: 12.5% by weight, and $CeO_2$: 2.92% by weight, and was mixed for 10 minutes with an agate pestle and mortar. At this time, the ratio of Ce in the starting powder was 2.4% by weight. Thereafter, an obtained mixture was gravity-dropped and filled into a crucible made of boron nitride (volume filled by 38%).

Note that each of the processes of the weighing and mixing of the powder were performed inside a glove box capable of maintaining a nitrogen atmosphere including moisture equal to or less than 1 ppm and oxygen equal to or less than 1 ppm.

Thereafter, the crucible made of boron nitride in which the mixed powder was filled was set to an electric furnace of a graphite resistance heating system. Baking operation was carried out by first vacuuming the baking atmosphere with a diffusion pump, raising the temperature from room temperature to 800° C. at a rate of 1200° C. per hour, and at 800° C., introducing nitrogen having a purity of 99.999% by volume so that a pressure was made to be 0.92 MPa. The temperature was raised by 600° C. per hour until the temperature reached the baking temperature of 1800° C.; the powder was then baked at the baking temperature of 1800° C. for two hours.

After the baking, excess $Li_3N$ was removed by washing the obtained baked product with water, and subsequently, after rough pulverization, the baked product was crushed manually with use of a mortar made of aluminum, to obtain phosphor powder.

The Li content of the phosphor powder was 3.23% by weight, and the Ce content was 2.40% by weight.

The Li content measured by the ICP measurement was of a lower value than the theoretical composition of 4.09% by weight; it was considered that this was due to volatilization of Li during baking and by washing the baked product with water after the baking. The composition of the phosphor obtained in the present production example, found by the Li content measured by the ICP measurement, was $0.45CaAlSiN_3 \cdot 0.55LiSi_2N_3$.

It should be noted that the phosphor powder contained oxide starting material in the starting powder. Accordingly, the phosphor powder was a solid solution crystal incorporating Ce and oxygen.

Figure 3:
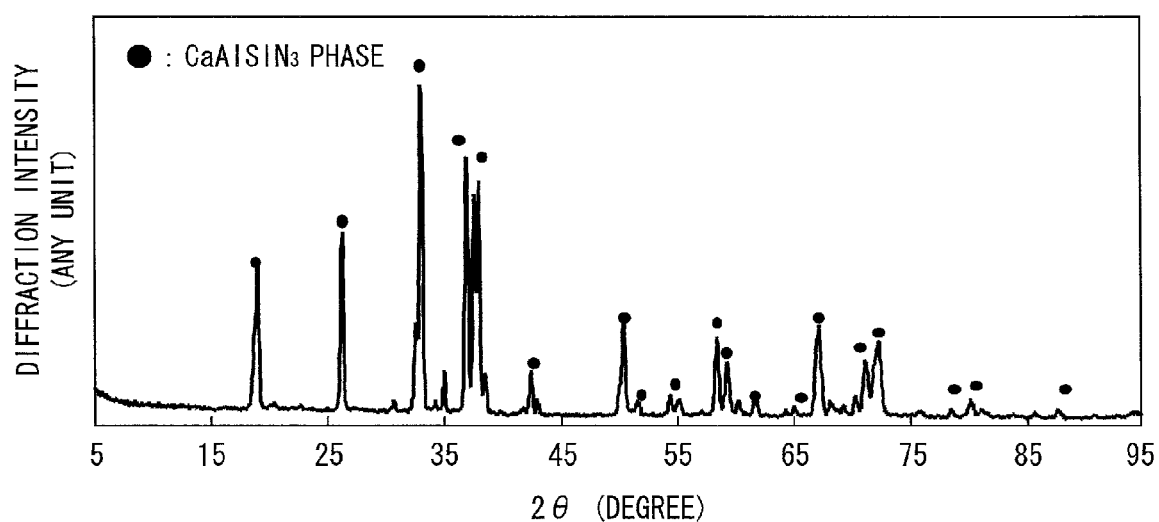
FIG. 3 is a graph representing results of XRD of phosphor powder obtained in Production Example 1-1.

The obtained phosphor powder was measured by powder X-ray diffractometry (XRD), which obtained a XRD chart illustrated in FIG. 3. It was confirmed that the phosphor powder had a crystalline structure whose main phase was a $CaAlSiN_3$ phase. Moreover, as a result of irradiating the phosphor powder with a lamp emitting light having a wavelength of 365 nm, it was confirmed that the phosphor powder emitted orange light.

Figure 4:
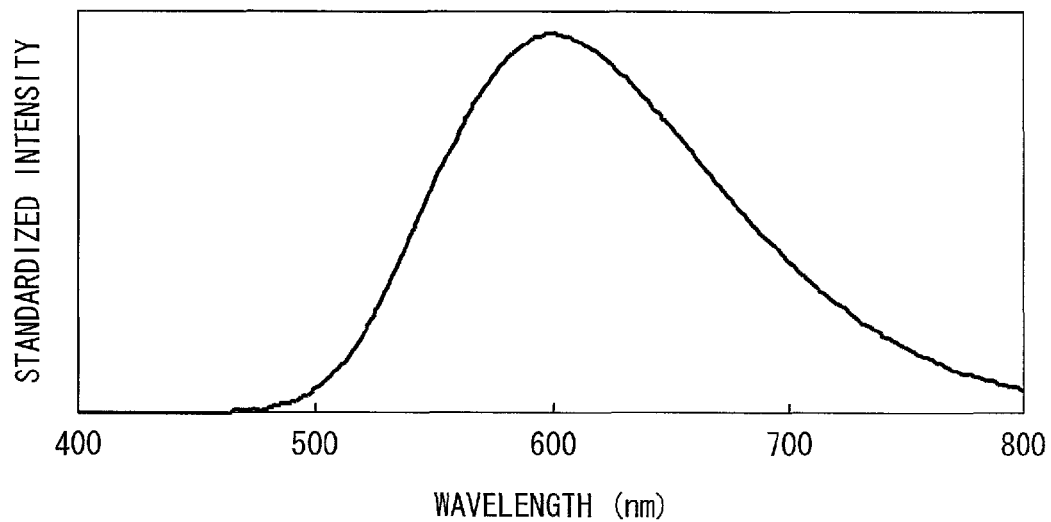
FIG. 4 is a graph representing an emission spectrum of the phosphor powder obtained in Production Example 1-1.
Figure 5:
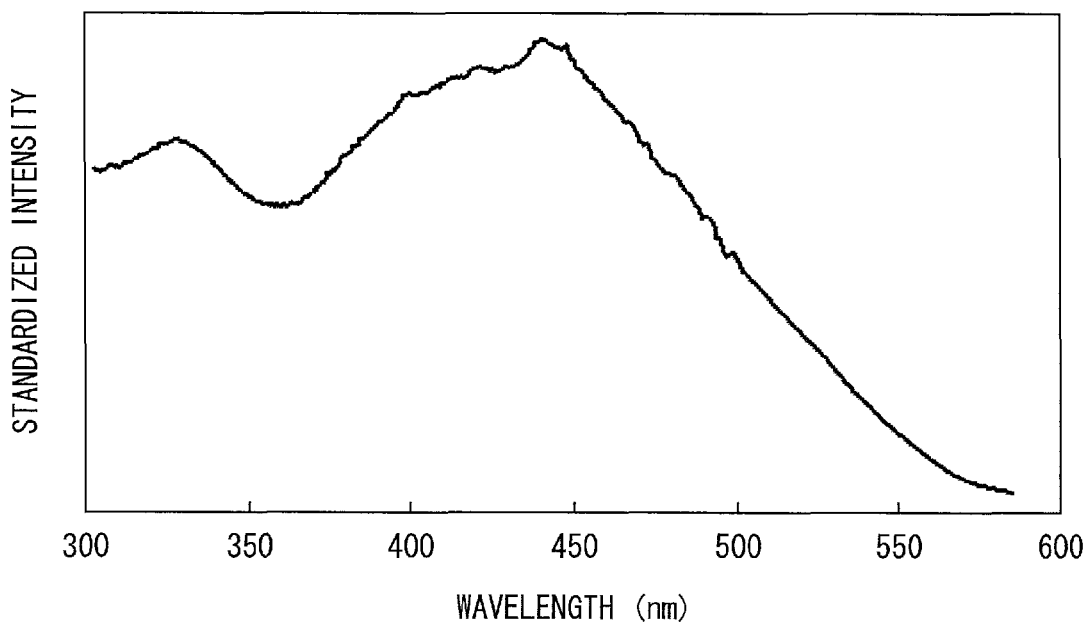
FIG. 5 is a graph representing an excitation spectrum of the phosphor powder obtained in Production Example 1-1.

FIG. 4 is a graph illustrating an emission spectrum of the obtained phosphor powder; the vertical axis represents emission intensity (any unit), and the horizontal axis represents wavelength (nm). Moreover, FIG. 5 is a graph illustrating an excitation spectrum of the obtained phosphor powder; the vertical axis represents excitation intensity (any unit), and the horizontal axis represents wavelength (nm).

Chromaticity coordinates of the emission spectrum illustrated in FIG. 4 was $(u', v')=(0.282, 0.556)$, a peak wavelength was 600 nm, and a FWHM was 142 nm.

Figure 6:
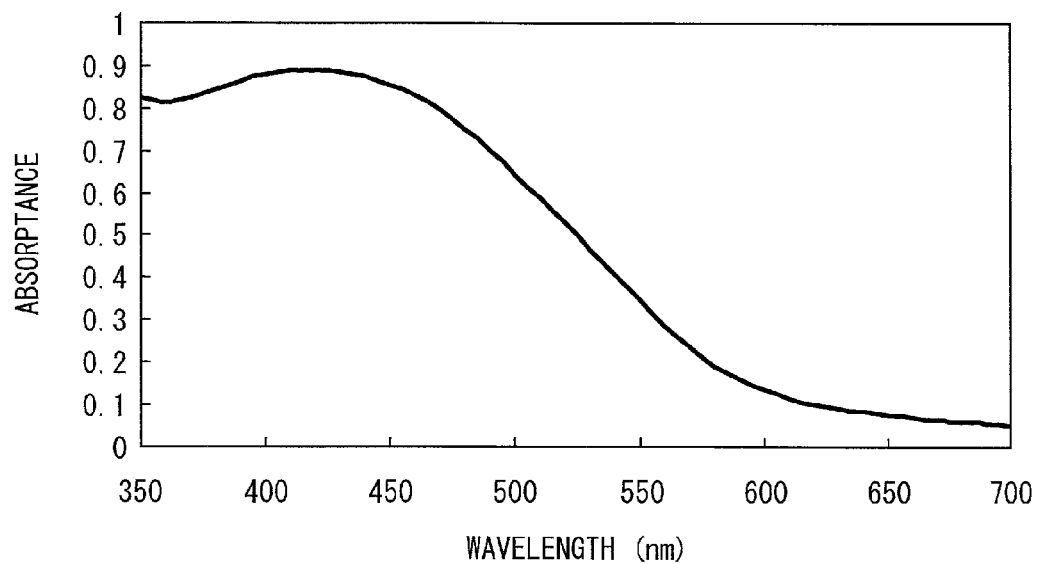
FIG. 6 is a graph representing an absorption spectrum of the phosphor powder obtained in Production Example 1-1.

Moreover, FIG. 6 illustrates an absorption spectrum of the phosphor powder obtained in the present production example, and ABS(530)/ABS(MAX)=0.52, where ABS (MAX) represents an absorptance at a peak wavelength and ABS(530) represents an absorptance at a wavelength of 530 nm, each in the absorptance of phosphor of the present production example.

Production Example 1-2

Preparation 2 of Orange Phosphor

A phosphor was synthesized by having a crystal composed of $0.3CaAlSiN_3 \cdot 0.7LiSi_2N_3$ serve as a crystal of a host material, and activating this with Ce.

More specifically, to obtain a compound having a theoretical composition formula of $Ce_{0.066}Li_{0.1148}Ca_{0.0492}Al_{0.0492}Si_{0.2787}O_{0.0098}N_{0.4918}$, starting powder was weighed so that a whole amount was 2 g with a composition ratio of $Si_3N_4$:65.4% by weight, AlN: 10.1% by weight, $Li_3N$, 6.7% by weight, $Ca_3N_2$: 12.2% by weight, and $CeO_2$: 5.66% by weight, and the powder was mixed for 10 minutes with an agate pestle and mortar. At this time, a charge weight ratio of Ce was 4.6% by weight. Thereafter, an obtained mixture was gravity-dropped and filled into a crucible made of boron nitride (volume filled by 38%).

Note that each of the processes of the weighing and mixing of the powder were performed inside a glove box capable of maintaining a nitrogen atmosphere including moisture equal to or less than 1 ppm and oxygen equal to or less than 1 ppm.

Thereafter, the crucible made of boron nitride in which the mixed powder was filled was set to an electric furnace of a graphite resistance heating system. Baking operation was carried out by first vacuuming the baking atmosphere with a diffusion pump, raising the temperature from room temperature to 800° C. at a rate of 1200° C. per hour, and at 800° C., introducing nitrogen having a purity of 99.999% by volume so that a pressure was made to be 0.92 MPa. The temperature was raised by 600° C. per hour until the temperature reached the baking temperature of 1800° C., and the powder was baked at the baking temperature of 1800° C. for two hours. After the baking, excess $Li_3N$ was removed by washing the obtained baked product with water, and subsequently, after rough pulverization, the baked product was crushed manually with use of a mortar made of aluminum, to obtain phosphor powder.

The Li content of the phosphor powder was 3.19% by weight, and the Ce content was 4.66% by weight.

The Li content measured by the ICP measurement was of a lower value than the theoretical composition of 4.06% by weight; it was considered that this was due to the volatilization of Li during baking and by washing the baked product with water after the baking. The composition of the phosphor obtained in the present production example, found by the Li content measured by the ICP measurement, was $0.46CaAlSiN_3 \cdot 0.54LiSi_2N_3$.

It should be noted that the phosphor powder contained oxide starting material in the starting powder. Accordingly, the phosphor powder was a solid solution crystal incorporating Ce and oxygen.

Figure 7:
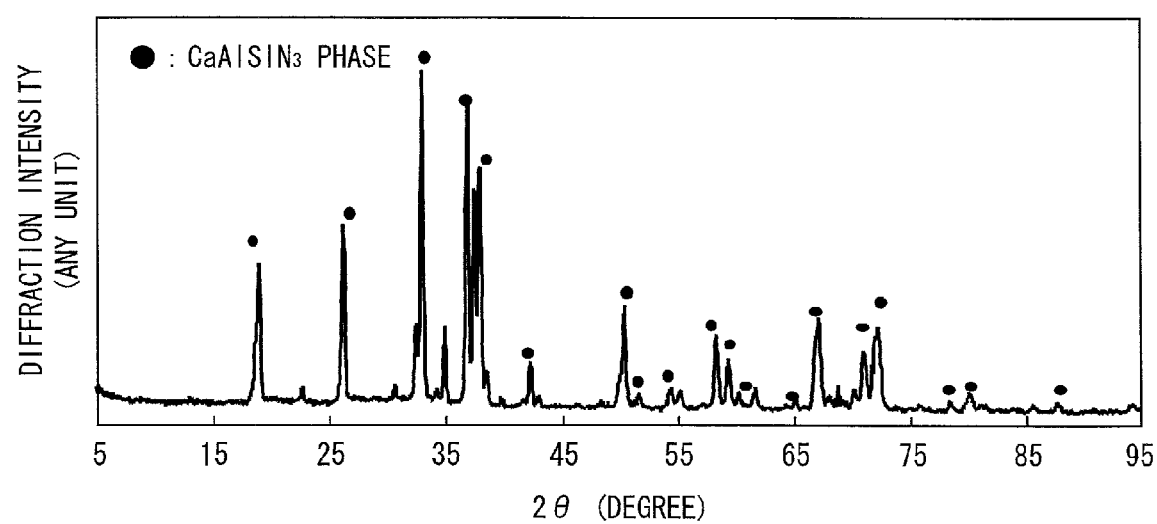
FIG. 7 is a graph representing results of XRD of phosphor powder obtained in Production Example 1-2.

The obtained phosphor powder was measured by powder X-ray diffractometry (XRD), which obtained a XRD chart illustrated in FIG. 7. It was confirmed that the phosphor powder had a crystalline structure whose main phase was a $CaAlSiN_3$ phase. Moreover, as a result of irradiating the phosphor powder with a lamp that emits light having a wavelength of 365 nm, it was confirmed that the phosphor powder emitted orange light.

Figure 8:
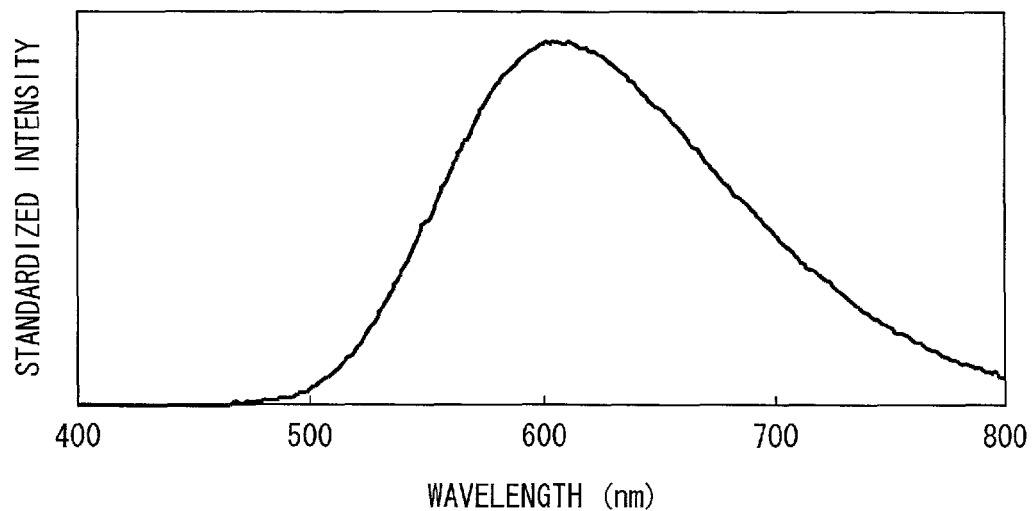
FIG. 8 is a graph representing an emission spectrum of the phosphor powder obtained in Production Example 1-2.
Figure 9:
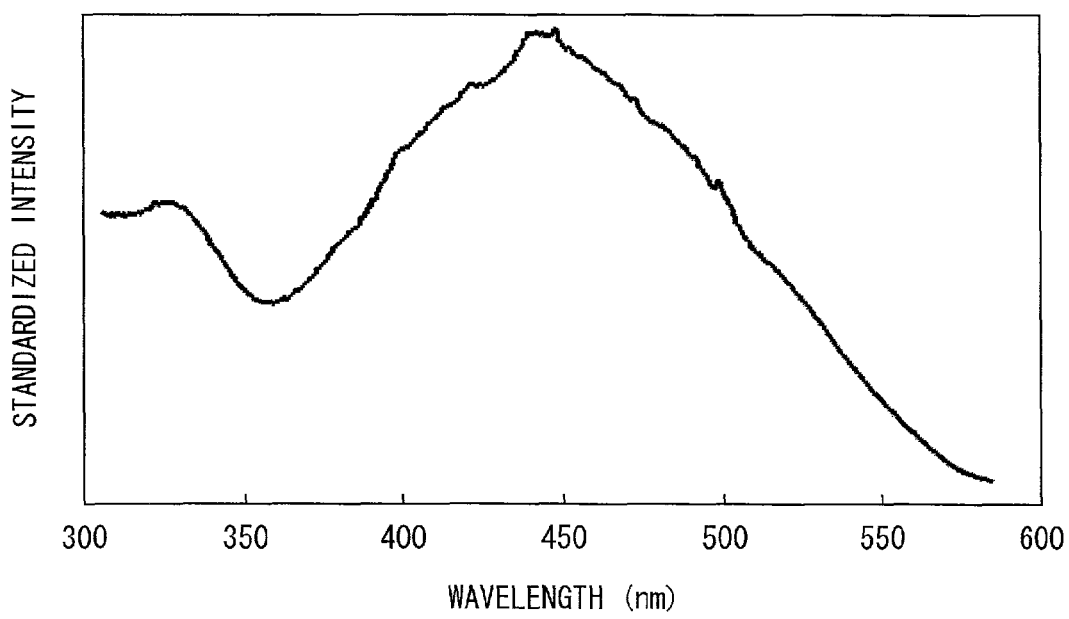
FIG. 9 is a graph representing an excitation spectrum of the phosphor powder obtained in Production Example 1-2.

FIG. 8 is a graph illustrating an emission spectrum of the obtained phosphor powder; the vertical axis represents emission intensity (any unit), and the horizontal axis represents wavelength (nm). Moreover, FIG. 9 is a graph illustrating an excitation spectrum of the obtained phosphor powder; the vertical axis represents excitation intensity (any unit), and the horizontal axis represents wavelength (nm).

Chromaticity coordinates of the emission spectrum illustrated in FIG. 8 was $(u', v')=(0.297, 0.554)$, a peak wavelength was 606 nm, and a FWHM was 146 nm.

Figure 10:
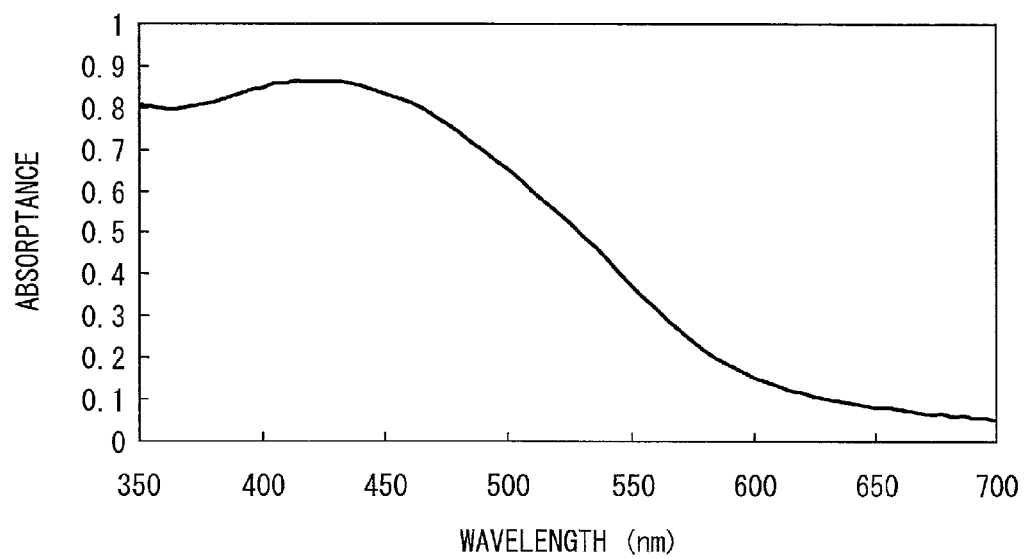
FIG. 10 is a graph representing an absorption spectrum of the phosphor powder obtained in Production Example 1-2.

Moreover, FIG. 10 illustrates an absorption spectrum of the phosphor powder obtained in the present production example, and ABS(530)/ABS(MAX)=0.57, where ABS (MAX) represents an absorptance at a peak wavelength and ABS(530) represents an absorptance at a wavelength of 530 nm, each in the absorptance of phosphor of the present production example.

Production Examples 1-3-1 to 1-3-11

Preparation 3 of Orange Phosphor

Various solid solution crystals were synthesized, in which Ce and oxygen were incorporated and whose Ce content and Li content were varied by mixing $Si_3N_4$, AlN, $Li_3N$, $Ca_3N_2$, $CeO_2$ in composition ratios shown in Table 1. Table 2 shows the Ce content and Li content obtained by ICP, and Table 3 shows composition of the phosphors found from the Li content obtained by the ICP measurement.

TABLE 1

| | Starting powder mixed ratio | | | | |
|---|---|---|---|---|---|
| | $CeO_2$ wt % | $Li_3N$ wt % | $Ca_3N_2$ wt % | AlN wt % | $Si_3N_4$ wt % |
| P. Ex. 1-3-1 | 1.30 | 1.75 | 29.84 | 24.75 | 42.36 |
| P. Ex. 1-3-2 | 1.33 | 2.69 | 26.76 | 22.19 | 47.02 |
| P. Ex. 1-3-3 | 1.37 | 3.68 | 23.52 | 19.51 | 51.93 |
| P. Ex. 1-3-4 | 1.40 | 4.72 | 20.11 | 16.68 | 57.09 |
| P. Ex. 1-3-5 | 1.44 | 5.82 | 16.51 | 13.70 | 62.53 |
| P. Ex. 1-3-6 | 1.48 | 6.98 | 12.73 | 10.56 | 68.26 |
| P. Ex. 1-3-7 | 1.52 | 8.20 | 8.73 | 7.24 | 74.32 |
| P. Ex. 1-3-8 | 3.07 | 9.35 | 4.41 | 3.66 | 79.50 |
| P. Ex. 1-3-9 | 2.92 | 6.88 | 12.54 | 10.40 | 67.26 |
| P. Ex. 1-3-10 | 7.59 | 1.28 | 25.41 | 21.07 | 44.65 |
| P. Ex. 1-3-11 | 12.03 | 1.22 | 24.18 | 20.06 | 42.50 |

P. Ex.: Production Example
wt %: % by weight

TABLE 2

| | ICP measurement result | |
|---|---|---|
| | Li wt % | Ce wt % |
| P. Ex. 1-3-1 | 0.23 | 1.07 |
| P. Ex. 1-3-2 | 0.83 | 1.09 |
| P. Ex. 1-3-3 | 1.43 | 1.12 |
| P. Ex. 1-3-4 | 2.04 | 1.15 |
| P. Ex. 1-3-5 | 2.64 | 1.18 |
| P. Ex. 1-3-6 | 3.24 | 1.21 |
| P. Ex. 1-3-7 | 3.85 | 1.25 |
| P. Ex. 1-3-8 | 4.43 | 2.53 |
| P. Ex. 1-3-9 | 3.23 | 2.40 |
| P. Ex. 1-3-10 | 0.20 | 6.22 |
| P. Ex. 1-3-11 | 0.21 | 9.91 |

P. Ex.: Production Example
wt %: % by weight

TABLE 3

| | Phosphor composition |
|---|---|
| P. Ex. 1-3-1 | $0.96CaAlSiN_3 \cdot 0.04LiSi_2N_3$ |
| P. Ex. 1-3-2 | $0.86CaAlSiN_3 \cdot 0.14LiSi_2N_3$ |
| P. Ex. 1-3-3 | $0.76CaAlSiN_3 \cdot 0.24LiSi_2N_3$ |
| P. Ex. 1-3-4 | $0.65CaAlSiN_3 \cdot 0.35LiSi_2N_3$ |
| P. Ex. 1-3-5 | $0.55CaAlSiN_3 \cdot 0.45LiSi_2N_3$ |
| P. Ex. 1-3-6 | $0.45CaAlSiN_3 \cdot 0.55LiSi_2N_3$ |
| P. Ex. 1-3-7 | $0.35CaAlSiN_3 \cdot 0.65LiSi_2N_3$ |
| P. Ex. 1-3-8 | $0.25CaAlSiN_3 \cdot 0.75LiSi_2N_3$ |
| P. Ex. 1-3-9 | $0.45CaAlSiN_3 \cdot 0.55LiSi_2N_3$ |
| P. Ex. 1-3-10 | $0.97CaAlSiN_3 \cdot 0.03LiSi_2N_3$ |
| P. Ex. 1-3-11 | $0.97CaAlSiN_3 \cdot 0.03LiSi_2N_3$ |

P. Ex.: Production Example

It should be noted that the phosphor powder contained oxide starting material in the starting powder. Accordingly, the phosphor powder was a solid solution crystal that incorporates Ce and oxygen.

FIG. 30 shows a graph of Li content dependency of the emission intensity for each of the obtained various solid solution crystals.

As illustrated in FIG. 30, the emission intensity tends to increase with a Li content in the solid solution crystal of equal to or less than 4% by weight. The cause for a decrease in the emission intensity when the Ce content and Li content in the solid solution crystal are off the foregoing range is considered to be caused by (i) the content of the element contributing to the light emission being too low, (ii) the generation of a hetero-phase, or like cause.

Figure 31:
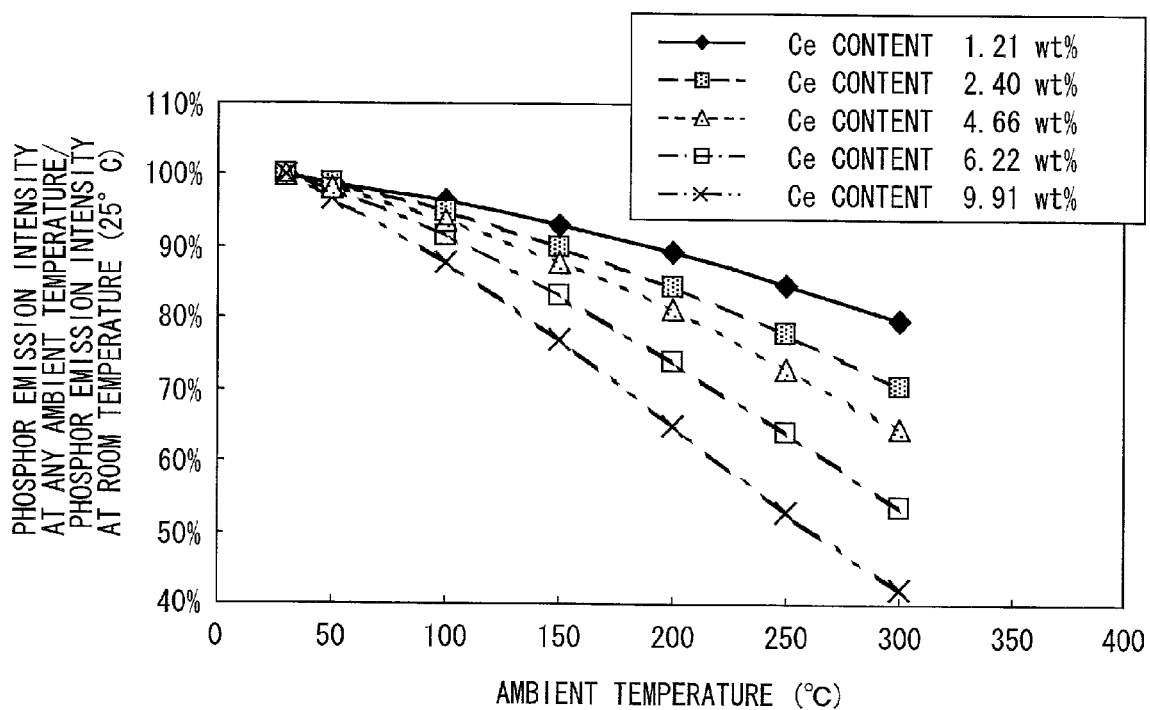
FIG. 31 is a graph representing an ambient temperature dependency of emission intensity of a solid solution crystal that incorporates Ce and oxygen, when the solid solution crystal is excited with light having a wavelength of 450 nm.
Figure 32:
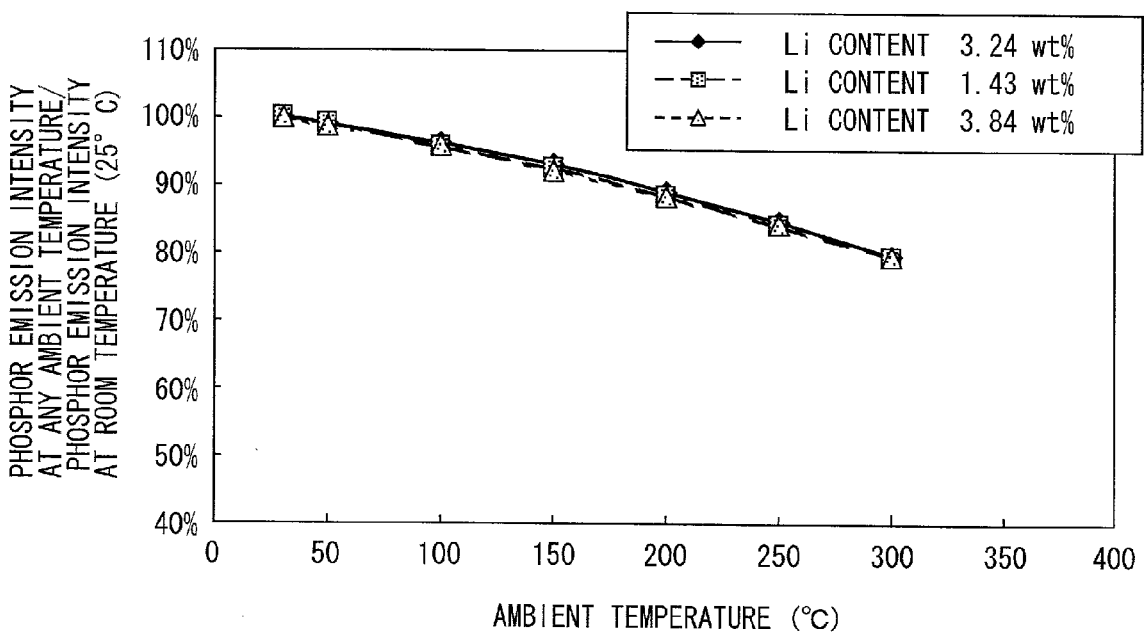
FIG. 32 is a graph representing an ambient temperature dependency of emission intensity of a solid solution crystal that incorporates Ce and oxygen, when the solid solution crystal is excited with light having a wavelength of 450 nm.

Next, FIG. 31 and FIG. 32 illustrate a graph showing ambient temperature dependency of emission intensities when the obtained various solid solution crystals were excited with light having a wavelength of 450 nm. It can be understood from FIG. 31 and FIG. 32 that even if the Li content in the solid solution crystal increases, the emission intensity does not decrease in an elevated temperature environment, whereas when the Ce content increases, the emission intensity tends to decrease in the elevated temperature environment. Thus, it can be understood that the Ce content in the solid solution crystal is preferably equal to or less than 6% by weight. It can be understood in viewpoint of emission intensity in an elevated temperature environment, that the Li content is not limited in particular.

Figure 33:
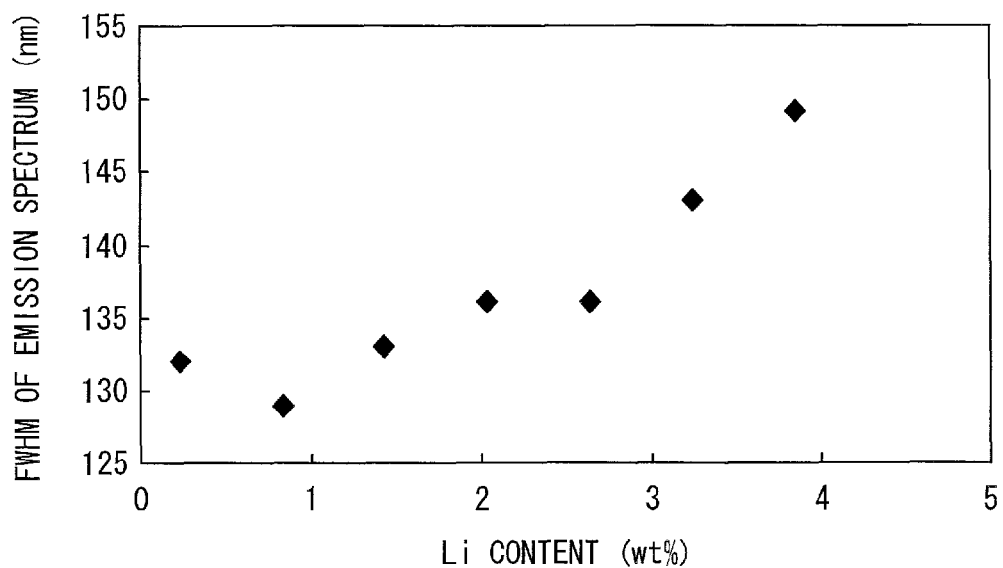
FIG. 33 is a graph representing an Li concentration dependency of a FWHM (full width at half maximum) of an emission spectrum of a solid solution crystal that incorporates Ce and oxygen, when the solid solution crystal is excited with light having a wavelength of 450 nm.

Moreover, FIG. 33 illustrates a Li content dependency of the FWHM in the emission spectrum when the various solid solution crystals were excited with light having a wavelength of 450 nm. It can be understood from FIG. 33 that the FWHM of the emission spectrum tends to increase in particular when the Li content is equal to or more than 1.5% by weight.

The emission intensities described in the present production example were measured by a device that combines MCPD-7000 (manufactured by Otsuka Electronics, Co. Ltd.) with an integrating sphere.

Production Example 2-1

Preparation 1 of Eu-Activated β-Sialon Phosphor

In order to obtain an Eu-activated β-sialon phosphor in which Eu was 0.09 at. %-activated in a substance having the composition formula represented by $Si_{6-z'}Al_{z'}O_{z'}N_{8-z'}$, where z' was 0.23, powders were weighed so as to have a composition of 95.82% by weight of α-silicon nitride powder, 3.37% by weight of aluminum nitride powder and 0.81% by weight of europium oxide powder. The powders were mixed for 10 or more minutes with use of a mortar and pestle made of sintered silicon nitride, to obtain a powder aggregate. The powder aggregate was gravity-dropped into a crucible made of boron nitride whose diameter was 20 mm and height was 20 mm.

Subsequently, the crucible was set to a gas pressure sintering furnace of a graphite resistance heating system. The baking atmosphere was vacuumed with a diffusion pump and was heated from room temperature to 800° C. at a rate of 500° C. per hour. Thereafter at 800° C., nitrogen having a purity of 99.999% by volume was introduced so that a pressure thereof was 1 MPa. The temperature was raised by 500° C. per hour until the temperature reached 1900° C., and further was held at this temperature for 8 hours to obtain a phosphor sample. The obtained phosphor sample was crushed with a mortar made of agate, and further was treated in a 1:1 mixed acid of 50% hydrofluoric acid and 70% nitric acid, to obtain phosphor powder.

Figure 11:
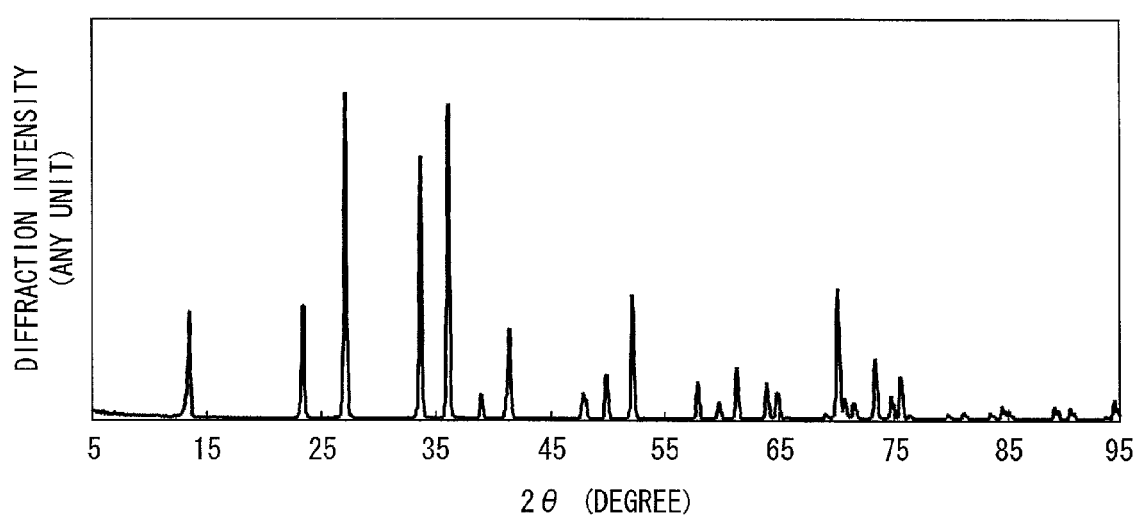
FIG. 11 is a graph representing results of XRD of phosphor powder obtained in Production Example 2-1.

The phosphor powder was measured by powder X-ray diffractometry (XRD), which obtained a XRD chart illustrated in FIG. 11. All charts obtained from the phosphor powder showed that the phosphor powder were of a β-sialon structure. Moreover, as a result of irradiating the phosphor powder with a lamp that emits light having a wavelength of 365 nm, it was confirmed that the phosphor powder emitted green light.

Figure 12:
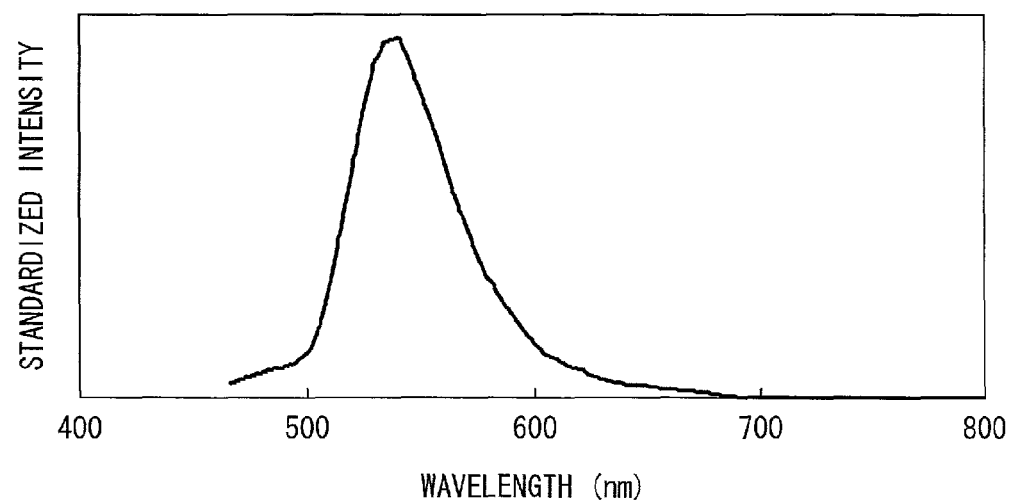
FIG. 12 is a graph representing an emission spectrum of the phosphor powder obtained in Production Example 2-1.

As a result of measuring the emission spectrum of the obtained Eu-activated β-sialon phosphor powder, an emission spectrum shown in FIG. 12 was produced. In FIG. 12, the vertical axis represents emission intensity (any unit), and the horizontal axis represents wavelength (nm). The chromaticity coordinates of the emission spectrum illustrated in FIG. 12 was (u', v')=(0.129, 0.570), its peak wavelength was 540 nm, and its FWHM was 53 nm.

Moreover, with use of an oxygen-nitrogen analyzer using a combustion method (TC436, manufactured by LECO Corporation), oxygen content contained in these synthesized powders was measured, thereby obtaining an oxygen content of 1.12% by weight. Moreover, as a result of measuring absorptance of light having a wavelength of 600 nm with use of MCPD-7000 (manufactured by Otsuka Electronics Co., Ltd.), the absorptance was 9.1%.

Production Example 2-2

Preparation 2 of Eu-Activated β-Sialon Phosphor

In order to obtain an Eu-activated 13-sialon phosphor in which Eu was 0.10 at. %-activated in a substance having a composition formula represented by $Si_{6-z'}Al_{z'}O_{z'}N_{8-z'}$, where z' was 0.06, powders were weighed by a predetermined amount so as to have a composition of 93.59% by weight of metal Si powder sifted through a sieve of 45 μm, 5.02% by weight of aluminum nitride powder, and 1.39% by weight of europium oxide powder. The powders were mixed for 10 or more minutes with use of a mortar and pestle made of sintered silicon nitride, to obtain a powder aggregate. The powder aggregate was gravity-dropped into a crucible made of boron nitride whose diameter was 20 mm and height was 20 mm.

Subsequently, the crucible was set to a gas pressure sintering furnace of a graphite resistance heating system. The baking atmosphere was vacuumed with a diffusion pump and was heated from room temperature to 800° C. at a rate of 500° C. per hour. Thereafter at 800° C., nitrogen having a purity of 99.999% by volume was introduced so that a pressure thereof was made to be 0.5 MPa. The temperature was raised by 500° C. per hour until the temperature reached 1300° C., thereafter the temperature was raised by 1° C. per minute until the temperature reached 1600° C.; this temperature was maintained for 8 hours. A synthesized sample was crushed into powder with a mortar made of agate, to obtain the powder sample.

Next, this powder was again subjected to heat treatment. After the powder baked at 1600° C. was crushed with use of a mortar and pestle made of silicon nitride, the powder was gravity-dropped into a crucible made of boron nitride whose diameter was 20 mm and height was 20 mm.

The crucible was set to the gas pressure sintering furnace of the graphite resistance heating system. The baking atmosphere was vacuumed with a diffusion pump and was heated from room temperature to 800° C. at a rate of 500° C. per hour. Thereafter at 800° C., nitrogen having a purity of 99.999% by volume was introduced so that a pressure thereof was made to be 1 MPa. The temperature was raised by 500° C. per hour until the temperature reached 1900° C., and further this temperature was kept for 8 hours to obtain a phosphor sample. The obtained phosphor sample was crushed by a mortar made of agate, and was further treated in a 1:1 mixed acid of 50% hydrofluoric acid and 70% nitric acid, to obtain phosphor powder.

Figure 13:
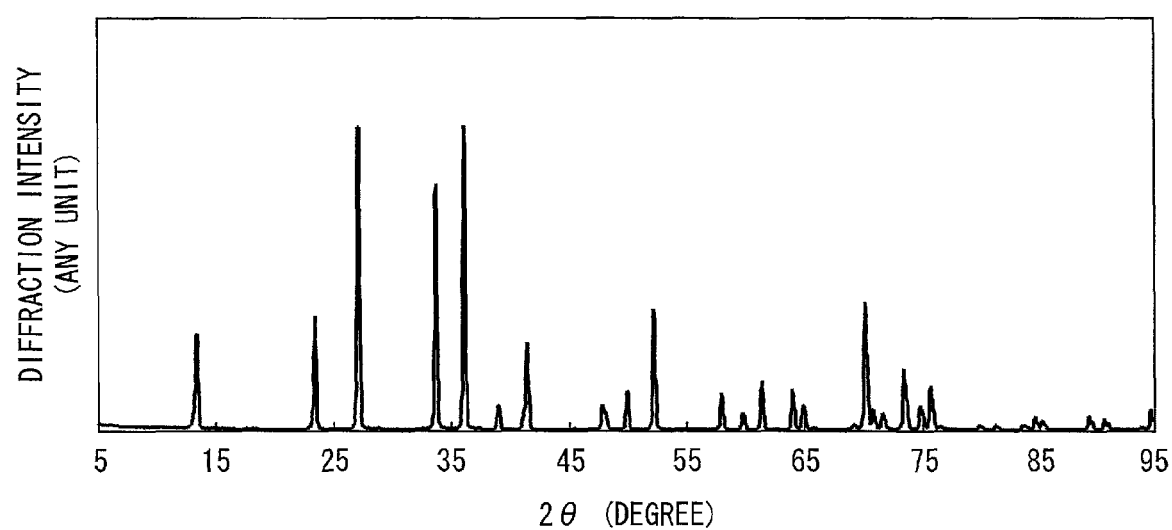
FIG. 13 is a graph representing results of XRD of phosphor powder obtained in Production Example 2-2.

The phosphor powder was measured by powder X-ray diffractometry (XRD), which obtained a XRD chart illustrated in FIG. 13. All charts obtained from the phosphor powder showed that the phosphor powder were of a β-sialon structure. Moreover, as a result of irradiating the phosphor powder with a lamp that emits light having a wavelength of 365 nm, it was confirmed that the phosphor powder emitted green light.

Figure 14:
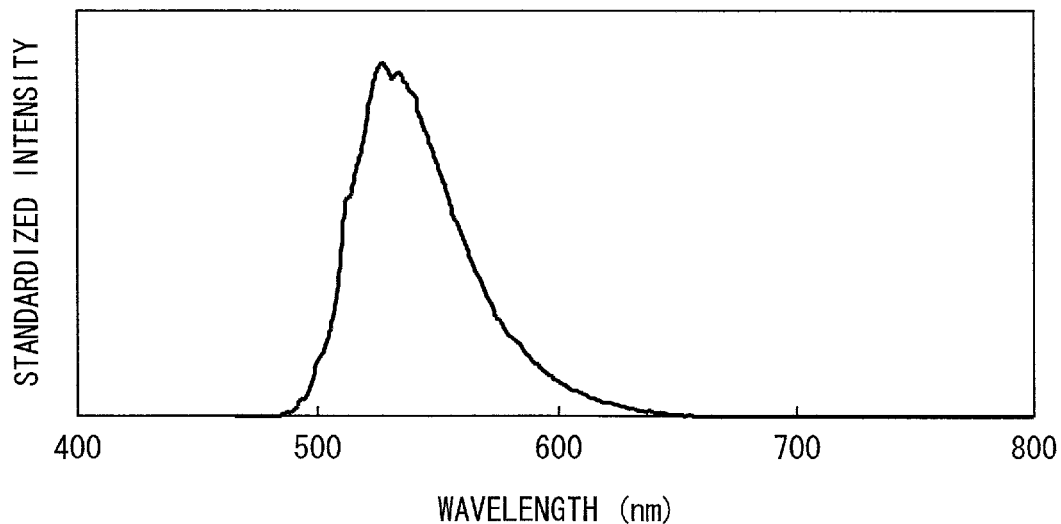
FIG. 14 is a graph representing an emission spectrum of the phosphor powder obtained in Production Example 2-2.

As a result of measuring the emission spectrum of the obtained Eu-activated β-sialon phosphor powder, an emission spectrum shown in FIG. 14 was produced. In FIG. 14, the vertical axis represents emission intensity (any unit), and the horizontal axis represents wavelength (nm). The chromaticity coordinates of the emission spectrum illustrated in FIG. 14 was (u', v')=(0.110, 0.577), its peak wavelength was 528 nm, and its FWHM was 51 nm. Moreover, with use of an oxygen-nitrogen analyzer using a combustion method (TC436, manufactured by LECO Corporation), oxygen content contained in these synthesized powder was measured, thereby obtaining an oxygen content of 0.4% by weight. Moreover, as a result of measuring absorptance of light having a wavelength of 600 nm with use of MCPD-7000 (manufactured by Otsuka Electronics Co., Ltd.), the absorptance was 12.5%.

Production Example 2-3

Preparation of Eu-Activated BSON Phosphor

With use of a mortar and pestle made of agate, powders were mixed so as to have a composition of 17.12% by weight of β-silicon nitride powder, 29.32% by weight of silicon oxide powder, 50.75% by weight of barium carbonate powder, and 2.81% by weight of europium oxide powder, thereby obtaining 50 g of a powder mixture. The obtained powder mixture was mixed into 150 cc of ethanol with a rolling ball mill using an agate ball and a nylon pot, to obtain a slurry thereof.

The obtained slurry was oven dried at 100° C., and an obtained powder aggregate was crushed with a dry rolling ball mill using an agate ball and a nylon pot, to obtain fine particles having a particle size of around 10 μm. The obtained fine particles were filled in an aluminum crucible and were slightly applied weight to mold by compression, and thereafter the fine particles were baked under a condition in air at 1100° C. for 3 hours. An obtained baked substance was crushed with the mortar made of agate, to obtain a precursor sample.

Next, the crucible was set to the gas pressure sintering furnace of the graphite resistance heating system. The baking atmosphere was vacuumed with a diffusion pump and was heated from room temperature to 800° C. at a rate of 500° C. per hour. Thereafter at 800° C., nitrogen having a purity of 99.999% by volume was introduced so that a pressure thereof was made to be 1 MPa. The temperature was raised by 500° C. per hour until the temperature reached 1300° C., and further this temperature was kept for 2 hours to obtain a phosphor sample.

The obtained baked substance was crushed by the mortar made of agate, and was compression molded by again filling the aluminum crucible with the baked substance and applying slight weight thereto. Thereafter, the molded substance was baked in a nitrogen atmosphere at 1300° C. for 48 hours. This baked substance was further crushed with the mortar made of agate, to obtain phosphor powder.

The phosphor powder was measured by powder X-ray diffractometry (XRD), which obtained charts by the phosphor powder, which all charts thus obtained exhibited that the phosphor powder were of a BSON structure. Moreover, as a result of irradiating the phosphor powder with a lamp that emits light having a wavelength of 365 nm, it was confirmed that the phosphor powder emitted green light.

Figure 15:
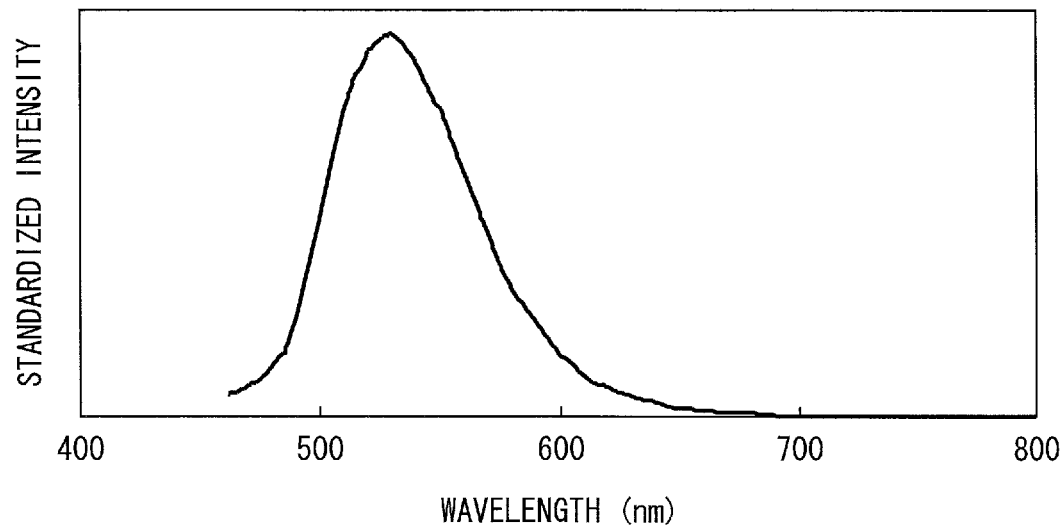
FIG. 15 is a graph representing an emission spectrum of phosphor powder obtained in Production Example 2-3.
Figure 18:
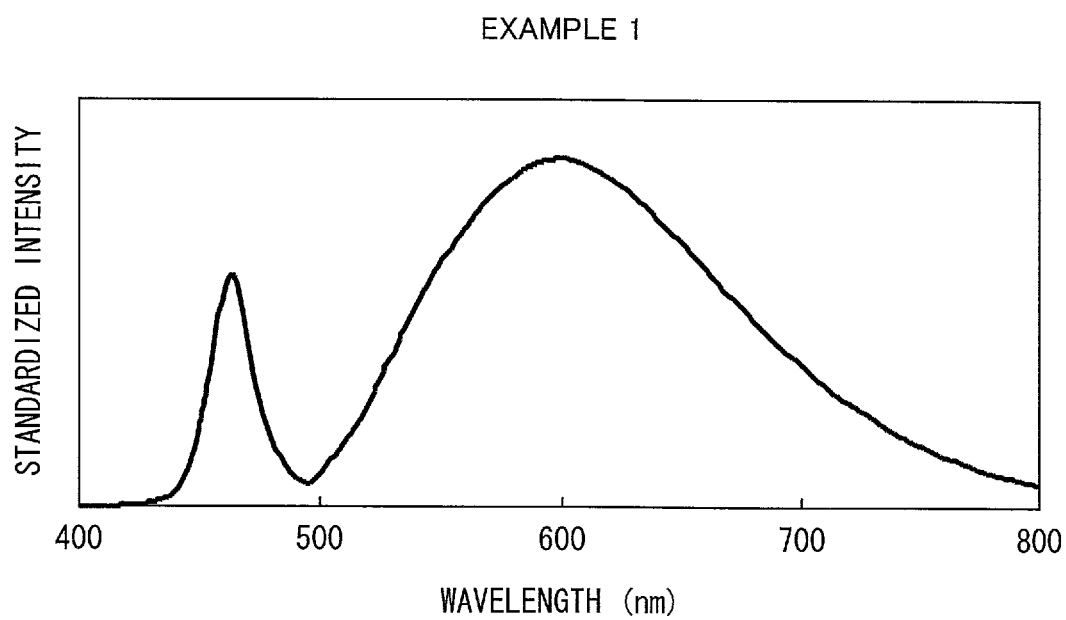
FIG. 18 is a graph representing an emission spectrum of a light-emitting device fabricated in Example 1.
Figure 19:
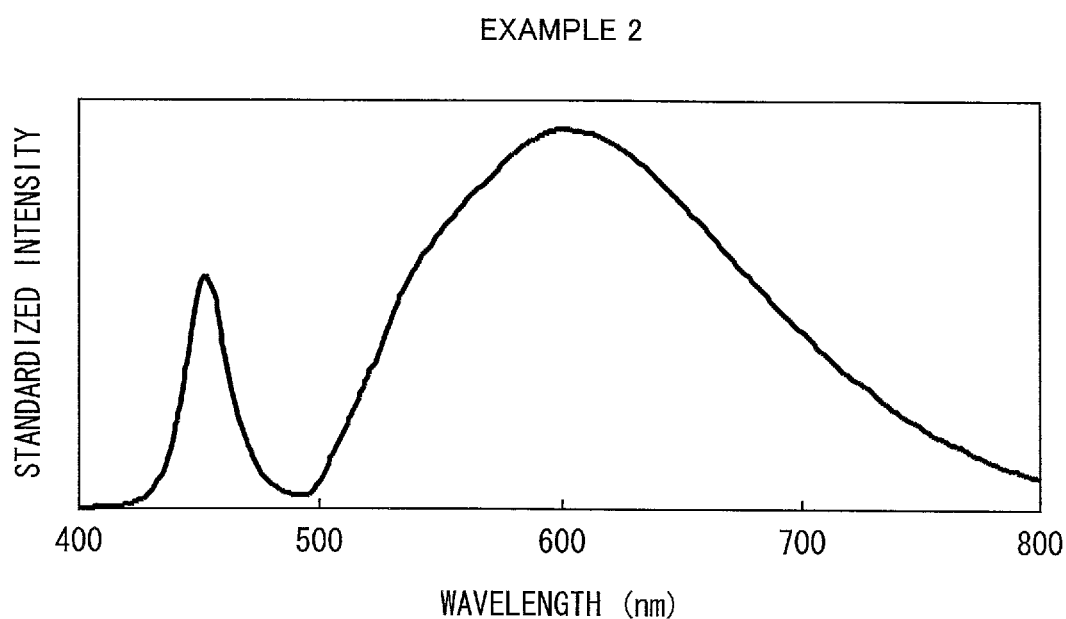
FIG. 19 is a graph representing an emission spectrum of a light-emitting device fabricated in Example 2.
Figure 20:
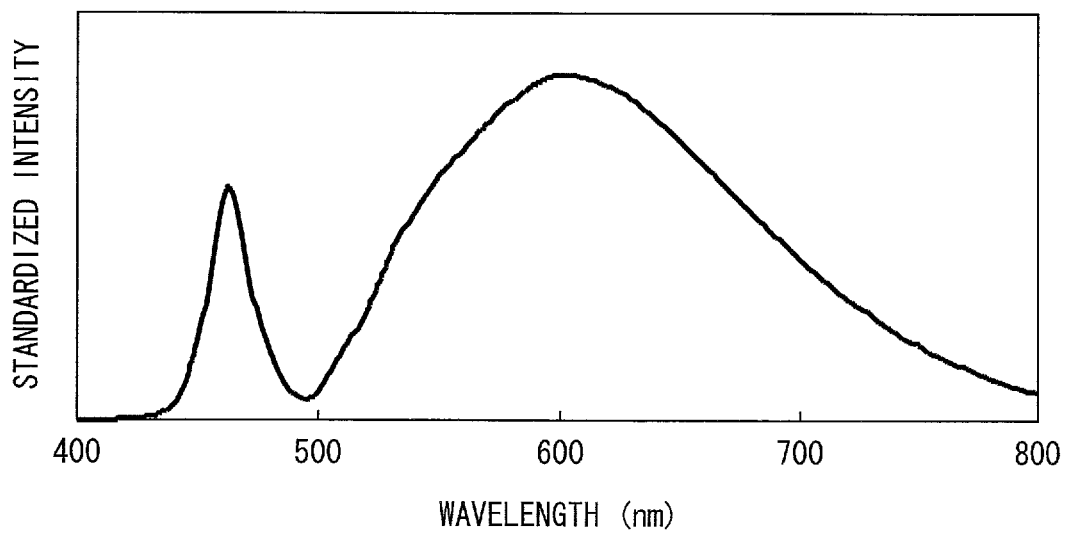
FIG. 20 is a graph representing an emission spectrum of a light-emitting device fabricated in Example 3.
Figure 21:
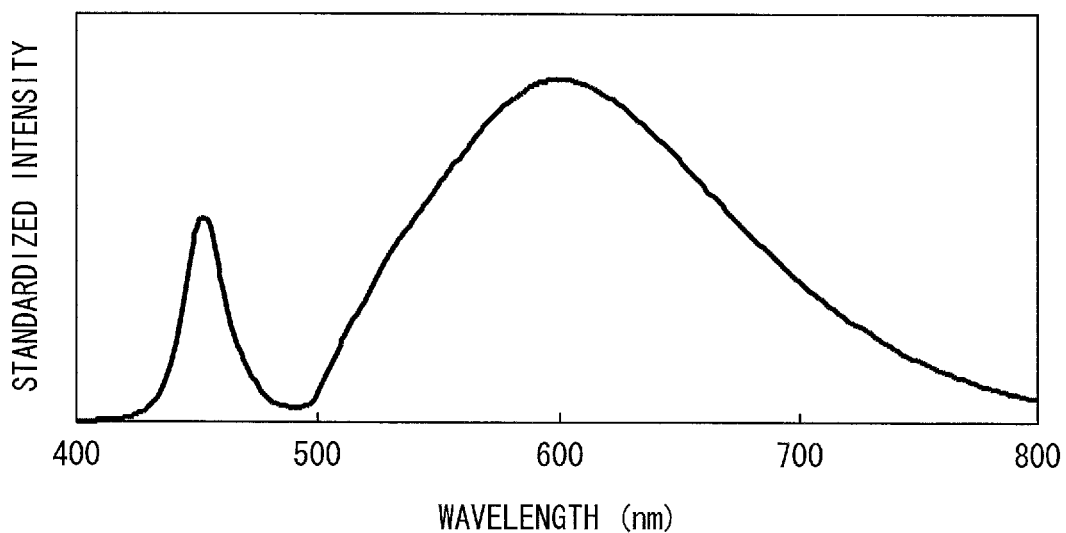
FIG. 21 is a graph representing an emission spectrum of a light-emitting device fabricated in Example 4.
Figure 22:
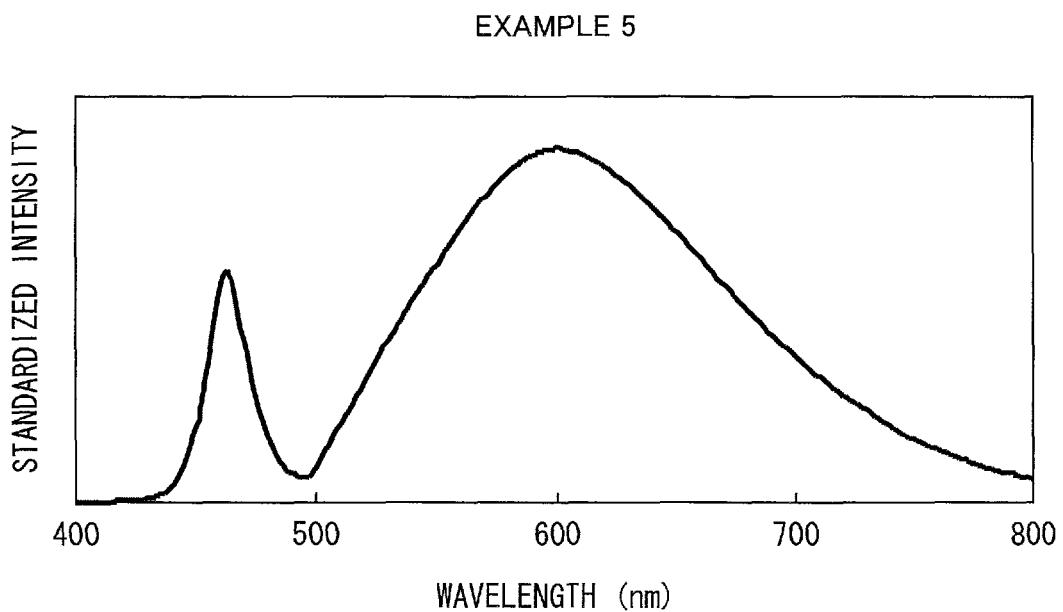
FIG. 22 is a graph representing an emission spectrum of a light-emitting device fabricated in Example 5.
Figure 23:
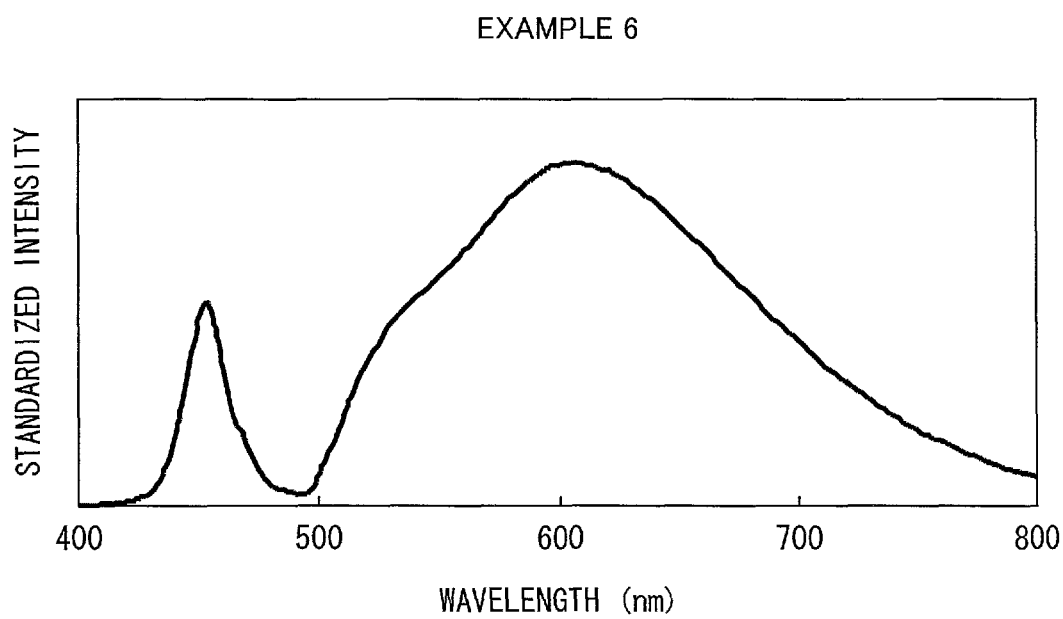
FIG. 23 is a graph representing an emission spectrum of a light-emitting device fabricated in Example 6.
Figure 24:
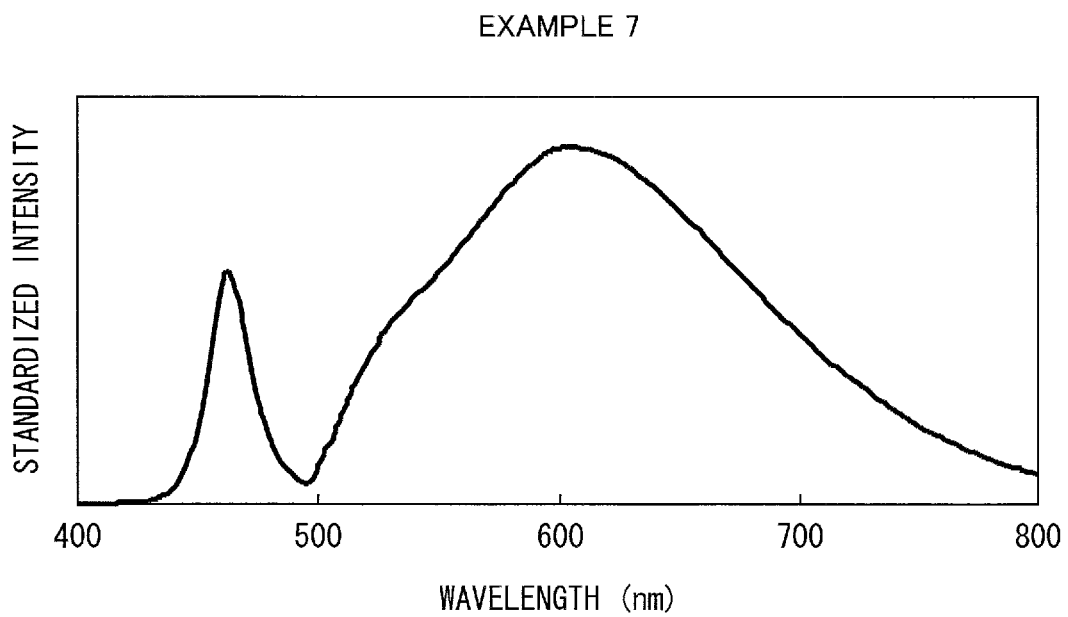
FIG. 24 is a graph representing an emission spectrum of a light-emitting device fabricated in Example 7.
Figure 25:
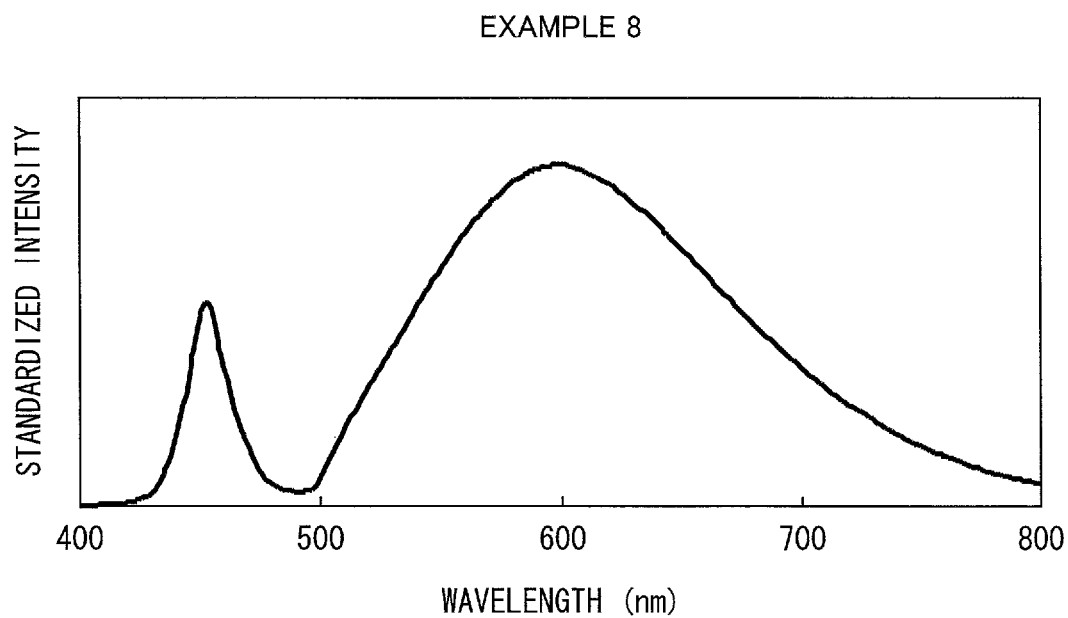
FIG. 25 is a graph representing an emission spectrum of a light-emitting device fabricated in Example 8.
Figure 26:
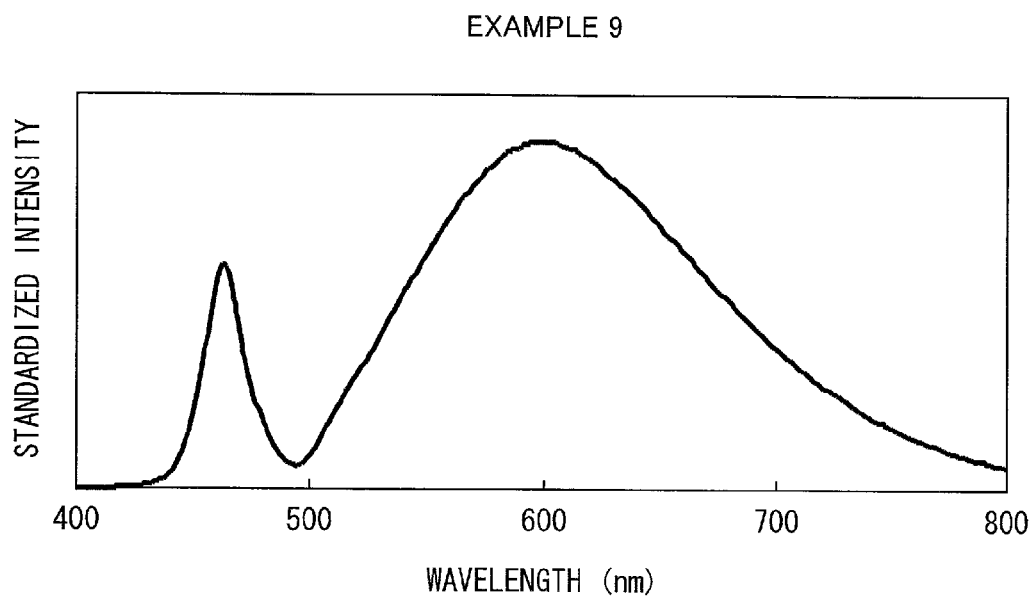
FIG. 26 is a graph representing an emission spectrum of a light-emitting device fabricated in Example 9.
Figure 27:
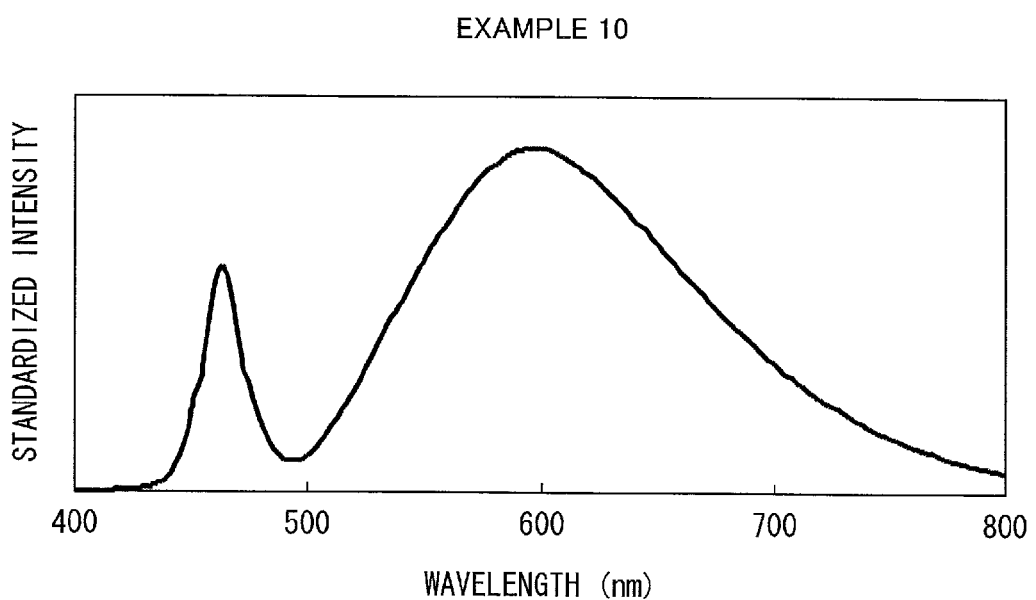
FIG. 27 is a graph representing an emission spectrum of a light-emitting device fabricated in Example 10.
Figure 28:
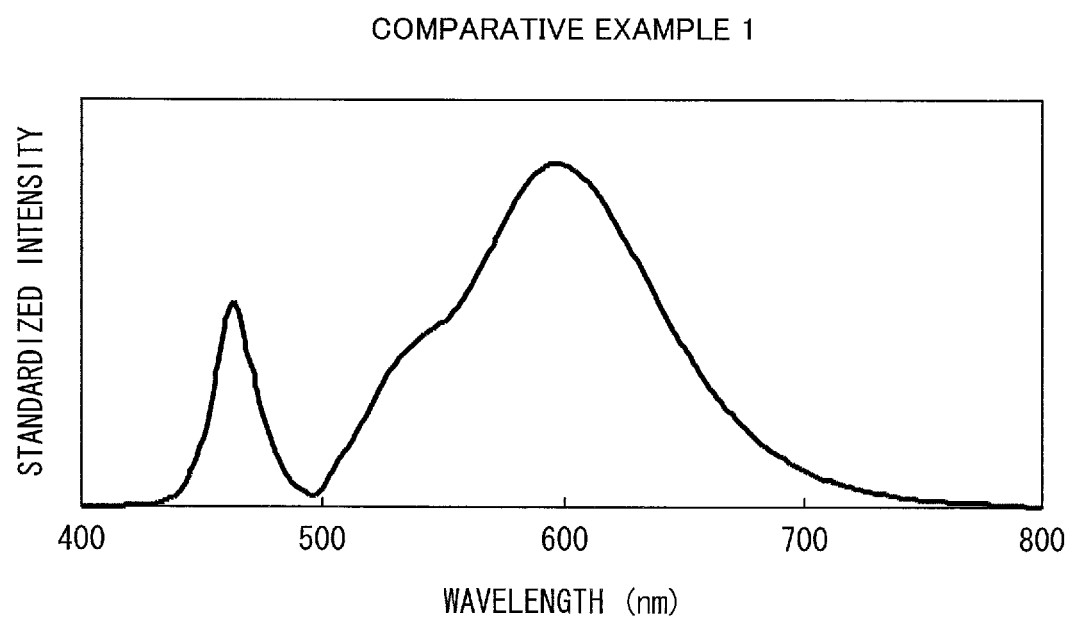
FIG. 28 is a graph representing an emission spectrum of a light-emitting device fabricated in Comparative Example 1.
Figure 29:
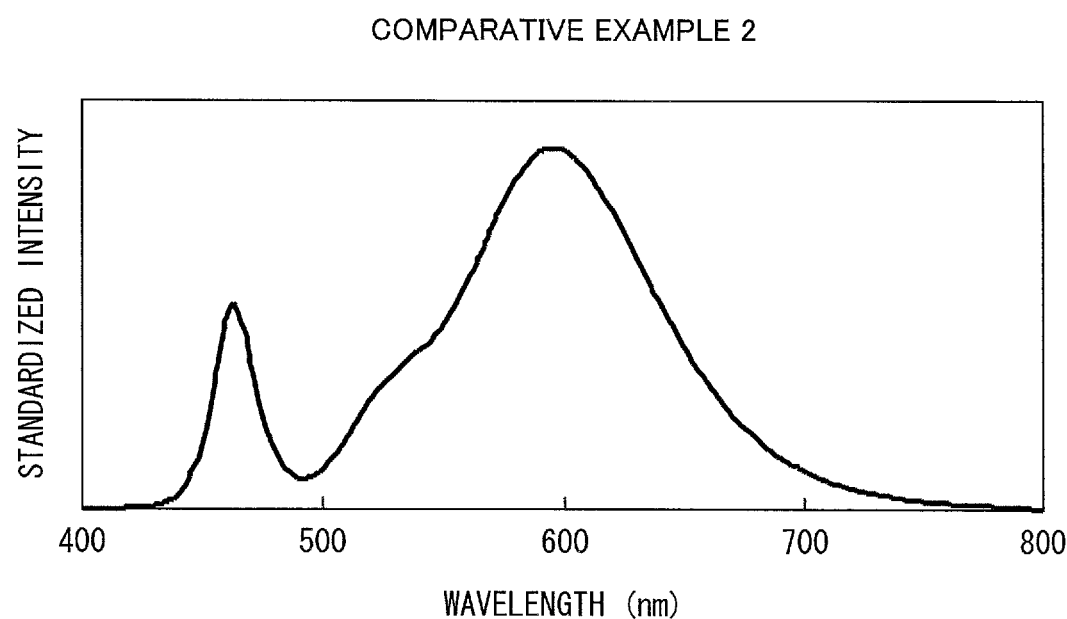
FIG. 29 is a graph representing an emission spectrum of a light-emitting device fabricated in Comparative Example 2.

As a result of measuring the emission spectrum of the obtained Eu-activated BSON phosphor powder, an emission spectrum shown in FIG. 15 was produced. In FIG. 15, the vertical axis represents emission intensity (any unit), and the horizontal axis represents wavelength (nm). The chromaticity coordinates of the emission spectrum illustrated in FIG. 15 was (u', v')=(0.116, 0.566), its peak wavelength was 528 nm, and its FWHM was 69 nm. Moreover, as a result of measuring absorptance of light having a wavelength of 600 nm with use of MCPD-7000 (manufactured by Otsuka Electronics Co., Ltd.), the absorptance was 10.4%.

Production Example 2-4

Preparation of Ce-Activated $Lu_3Al_5O_{12}$ Phosphor

So as to have a predetermined composition, 63.7% by weight of $Lu_2O_3$ powder, 6.1% by weight of $CeO_2$ powder, and 30.2% by weight of $Al_2O_3$ powder were weighed in air, and further, as a baking assistant, a predetermined amount of $BaF_2$ was added and was mixed with a rolling ball mill using an agate ball and a nylon pot, thereby obtaining a powder mixture. The obtained mixture was filled in a quartz crucible, was baked in the condition of a reduced atmosphere of $N_2$ (95%)+$H_2$ (5%) at 1400° C. for 5 hours. An obtained baked substance was crushed with an agate mortar, to obtain phosphor powder.

As a result of irradiating the obtained Ce-activated $Lu_3Al_5O_{12}$ phosphor powder with a lamp that emits light having a wavelength of 365 nm, it was confirmed that the phosphor powder emitted green light. As a result of measuring the emission spectrum of the powder, the emission spectrum as shown in FIG. 16 was produced.

In FIG. 16, the vertical axis represents emission intensity (any unit), and the horizontal axis represents wavelength (nm). The chromaticity coordinates of the emission spectrum illustrated in FIG. 16 was (u', v')=(0.191, 0.566), its peak wavelength was 540 nm, and its FWHM was 110 nm. Moreover, a result of measuring absorptance of light having a wavelength of 600 nm with use of MCPD-7000 (manufactured by Otsuka Electronics Co., Ltd.) was 9.3%.

Comparative Production Example 1

Preparation of Eu-Activated $Sr_{2.5}Ba_{0.5}SiO_5$ Phosphor

In air, 68.29% by weight of $SrCO_3$ powder, 18.48% by weight of $BaCO_3$ powder, 1.98% by weight of $Eu_2O_3$ powder, and 11.25% by weight of $SiO_2$ powder were weighed to have a predetermined composition, and were mixed with a rolling ball mill using an agate ball and a nylon pot, to obtain a powder mixture. The obtained mixture was filled in a quartz crucible, and was prebaked under $N_2$ atmosphere at 1400° C. for 3 hours. Thereafter, an obtained powder-baked substance was crushed by a mortar made of agate, to obtain a prebaked powder. The obtained prebaked powder was baked in a condition of a reduced atmosphere of $N_2$ (95%)+$H_2$ (5%) at 1550° C. for 3 hours, and an obtained baked substance was crushed by the agate mortar to obtain phosphor powder.

As a result of irradiating the obtained $Sr_{2.5}Ba_{0.5}SiO_5$:Eu phosphor powder with a lamp that emits light having a wavelength of 365 nm, it was confirmed that the phosphor powder emitted orange light. As a result of measuring the emission spectrum of the powder, an emission spectrum as shown in FIG. 17 was produced.

In FIG. 17, the vertical axis represents emission intensity (any unit), and the horizontal axis represents wavelength (nm). The chromaticity coordinates of the emission spectrum illustrated in FIG. 17 was (u', v')=(0.334, 0.549), its peak wavelength was 600 nm, and its FWHM was 82 nm. Moreover, ABS(530)/ABS(MAX)=0.82, where ABS(MAX) represents an absorptance in a peak wavelength and ABS(530) represents an absorptance in a wavelength of 530 nm, each in an absorptance of the phosphor obtained in the present production example.

Preparation of Semiconductor Light-Emitting Device

Examples 1 to 10

Semiconductor light-emitting devices of Examples 1 to 10 were prepared, each of which had the configuration illustrated in FIG. 1, with use of mold resin. The mold resin is one in which a phosphor shown in Table 4 is mixed with silicone resin (product name: KER2500, manufactured by Shin-Etsu Chemical Co., Ltd.) at a weight ratio shown in Table 4, in such a manner that the phosphor is dispersed inside the silicone resin.

As the semiconductor light-emitting element, an LED (Product name: EZR, manufactured by Cree, Inc.) was used, which had a light emission peak wavelength as shown in Table 4.

The mixed ratio with the mold resin and the peak wavelength of the LED were adjusted so that color temperatures of each of the light-emitting devices were that of an incandescent lamp. FIGS. 18 to 27 show emission spectra of the semiconductor light emitting devices exemplified in the present Examples, and Table 5 show various properties of the semiconductor light-emitting devices.

Comparative Examples 1 and 2

Semiconductor light-emitting devices of Comparative Examples 1 and 2 were prepared, each of which had the configuration illustrated in FIG. 1, with use of mold resin. The mold resin is one in which a phosphor shown in Table 4 is mixed with silicone resin (product name: KER2500, manufactured by Shin-Etsu Chemical Co., Ltd.) at a weight ratio shown in Table 4, in such a manner that the phosphor is dispersed inside the silicone resin.

As the semiconductor light-emitting element, an LED (Product name: EZR, manufactured by Cree, Inc.) was used, which had a light emission peak wavelength as shown in Table 4.

The mixed ratio with the mold resin and the peak wavelength of the LED were adjusted so that color temperatures of each of the light-emitting devices were that of an incandescent lamp.

The emission spectra of the semiconductor light emitting devices exemplified in FIGS. 18 to 29 were measured by a spectrophotometer (Product name: MCPD-7000, manufactured by Otsuka Electronics, Co. Ltd.), and indices shown in Tables 5 and 6 were calculated based on the measured emission spectra. Moreover, the light emission efficiency (brightness) of the semiconductor light-emitting devices was measured with use of a measurement system that combines a spectrophotometer (Product name: MCPD-7000, manufactured by Otsuka Electronics, Co., Ltd.) with an integrating sphere.

TABLE 4

|  | LED peak wavelength (nm) | Orange phosphor | Green phosphor | Resin/phosphor weight ratio | Green phosphor/orange phosphor weight ratio |
|---|---|---|---|---|---|
| Example 1 | 460 | P. Ex. 1-1 | P. Ex. 2-1 | 6.87 | 0.21 |
| Example 2 | 450 | P. Ex. 1-2 | P. Ex. 2-1 | 6.23 | 0.29 |
| Example 3 | 460 | P. Ex. 1-2 | P. Ex. 2-1 | 6.65 | 0.24 |
| Example 4 | 450 | P. Ex. 1-1 | P. Ex. 2-2 | 6.48 | 0.24 |
| Example 5 | 460 | P. Ex. 1-1 | P. Ex. 2-2 | 6.99 | 0.17 |
| Example 6 | 450 | P. Ex. 1-2 | P. Ex. 2-2 | 6.34 | 0.26 |
| Example 7 | 460 | P. Ex. 1-2 | P. Ex. 2-2 | 6.79 | 0.20 |
| Example 8 | 450 | P. Ex. 1-1 | P. Ex. 2-3 | 6.33 | 0.27 |
| Example 9 | 460 | P. Ex. 1-1 | P. Ex. 2-3 | 6.77 | 0.21 |
| Example 10 | 460 | P. Ex. 1-1 | P. Ex. 2-4 | 5.72 | 0.48 |
| C. Example 1 | 460 | C. P. Ex. 1 | P. Ex. 2-1 | 3.07 | 0.30 |
| C. Example 2 | 460 | C. P. Ex. 1 | P. Ex. 2-4 | 2.17 | 1.10 |

C. Example: Comparative Example
P. Ex.: Production Example
C. P. Ex: Comparative Production Example

TABLE 5

|  | Ra | R9 | TCP | Duv | u' | v' | Semiconductor light-emitting device Light emission efficiency (%) |
|---|---|---|---|---|---|---|---|
| Example 1 | 74.5 | 3.9 | 2805.1 | −0.1 | 0.258 | 0.525 | 100 |
| Example 2 | 74.7 | 11.2 | 2808 | 0.1 | 0.258 | 0.525 | 94.4 |
| Example 3 | 77.4 | 15.7 | 2802.8 | −0.1 | 0.258 | 0.525 | 95.4 |
| Example 4 | 74.3 | 4.8 | 2802.2 | 0.2 | 0.258 | 0.526 | 97.9 |
| Example 5 | 76.5 | 8.3 | 2801.8 | 0 | 0.258 | 0.525 | 99.1 |
| Example 6 | 79.2 | 20.9 | 2803.3 | 0.1 | 0.258 | 0.525 | 92.4 |
| Example 7 | 81.5 | 24.5 | 2802.8 | 0 | 0.258 | 0.525 | 93.6 |
| Example 8 | 73.4 | 1.6 | 2806 | 0.1 | 0.258 | 0.525 | 96.6 |
| Example 9 | 75.6 | 5.3 | 2800.1 | 0.3 | 0.258 | 0.526 | 97.7 |
| Example 10 | 73.9 | −1.8 | 2822.1 | 0.2 | 0.257 | 0.525 | 92 |
| C. Example 1 | 69.3 | −42.3 | 2807.8 | 0 | 0.258 | 0.525 | 92.1 |
| C. Example 2 | 68 | −47.6 | 2800.5 | 0.2 | 0.258 | 0.256 | 81.9 |

C. Example: Comparative Example

TABLE 6

|  | Orange phosphor | | Green phosphor | | Color rendering | | Semiconductor light-emitting device Light emission efficiency (%) | PI(40)/PI(MAX) |
|---|---|---|---|---|---|---|---|---|
|  | FWHM (nm) | Peak wavelength (nm) | FWHM (nm) | Peak wavelength (nm) | Ra | R9 | | |
| Ex. 1 | 142 | 600 | 53 | 540 | 74.5 | 3.9 | 100 | 0.814 |
| Ex. 2 | 146 | 606 | 53 | 540 | 74.7 | 11.2 | 94.4 | 0.859 |
| Ex. 3 | 146 | 606 | 53 | 540 | 77.4 | 15.7 | 95.4 | 0.862 |
| Ex. 4 | 142 | 600 | 51 | 528 | 74.3 | 4.8 | 97.9 | 0.820 |
| Ex. 5 | 142 | 600 | 51 | 528 | 76.5 | 8.3 | 99.1 | 0.822 |
| Ex. 6 | 146 | 606 | 51 | 528 | 79.2 | 20.9 | 92.4 | 0.854 |
| Ex. 7 | 146 | 606 | 51 | 528 | 81.5 | 24.5 | 93.6 | 0.855 |
| Ex. 8 | 142 | 600 | 68 | 528 | 73.4 | 1.6 | 96.6 | 0.821 |
| Ex. 9 | 142 | 600 | 68 | 528 | 75.6 | 5.3 | 97.7 | 0.815 |
| Ex. 10 | 142 | 600 | 110 | 540 | 73.9 | −1.8 | 92 | 0.791 |
| C. Ex. 1 | 82 | 600 | 53 | 540 | 69.3 | −42 | 92.1 | 0.621 |
| C. Ex. 2 | 82 | 600 | 110 | 540 | 68 | −48 | 81.9 | 0.629 |

Ex.: Example
C. Ex.: Comparative Example

As shown in Tables 4 and 6, the semiconductor light-emitting devices of Examples 1 to 10 satisfied requirements in the emission spectrum of phosphor, according to the present invention.

Next compares the light emitting properties of the light-emitting devices, with reference to Tables 5 and 6. First, giving focus on color rendering, the light-emitting devices of Examples 1 to 10 have a higher value in both Ra and R9 as compared to the light-emitting devices of Comparative Examples 1 and 2. Accordingly, it is apparent that the light-emitting devices of Examples 1 to 10 are suitable for general illumination such as household illumination and the like. This is due to the fact that the fluorescence spectra of phosphors in the light-emitting devices prepared in Examples 1 to 10 satisfy the requirements of the present invention. In particular, the light-emitting devices of Examples 1 to 10 have a wide FWHM for orange phosphor, so therefore the indicator for a red color component improves.

Furthermore, when comparing light-emitting devices having identical phosphor structures and being different in only their LED peak wavelengths, such as Examples 2 and 3, Examples 4 and 5, Examples 6 and 7, and Examples 8 and 9, the light-emitting devices having the LED peak wavelength of 460 nm show higher color rendering than that having the LED peak wavelength of 450 nm. From this point, it was confirmed that in the present invention, a good color rendering is exhibited with a LED peak wavelength of equal to or more than 455 nm.

Next the semiconductor light-emitting devices of Examples and Comparative Examples were compared, by giving focus on the light emission efficiency (brightness) of the light-emitting devices. In Comparative Example 2, the orange phosphor did not satisfy the requirements of the present invention; the FWHM of the emission spectrum of green phosphor was broader than that of orange phosphor, and absorption of green light by the orange phosphor was particularly great. Hence, the brightness is particularly low in Comparative Example 2.

Moreover, as in Comparative Examples 1 and 2, Examples 1 and 10, and Examples 5 and 9, in cases in which the peak wavelengths of the orange phosphor and green phosphor are the same and just the FWHM of the green phosphor differs, with a broad FWHM of the green phosphor, the color rendering tends to decrease together with the brightness. Namely, it is understandable in the present invention that it is advantageous to have a narrow FWHM for the green phosphor, not just in terms of the brightness, but also in terms of color rendering.

Furthermore, in comparisons between Examples 1, 3 and Comparative Examples 1 and between Example 10 and Comparative Example 2, whose configurations other than the orange phosphor are the same between the devices, it is apparent that by having the orange phosphor satisfy the requirement of ABS(530)/ABS(MAX)<0.6, the light emission efficiency is increased.

Examples 11 to 13

Comparative Examples 3 and 4

Semiconductor light-emitting devices were prepared, each of which had the configuration illustrated in FIG. 1, with use of mold resin. The mold resin is one in which a phosphor shown in Table 7 is mixed with silicone resin (product name: KER2500, manufactured by Shin-Etsu Chemical Co., Ltd.) with a weight ratio shown in Table 7, in such a manner that the phosphor is dispersed inside the silicone resin.

As the semiconductor light-emitting element, an LED (Product name: EZR, manufactured by Cree, Inc.) was used, which had a light emission peak wavelength of 460 nm.

Figure 34:
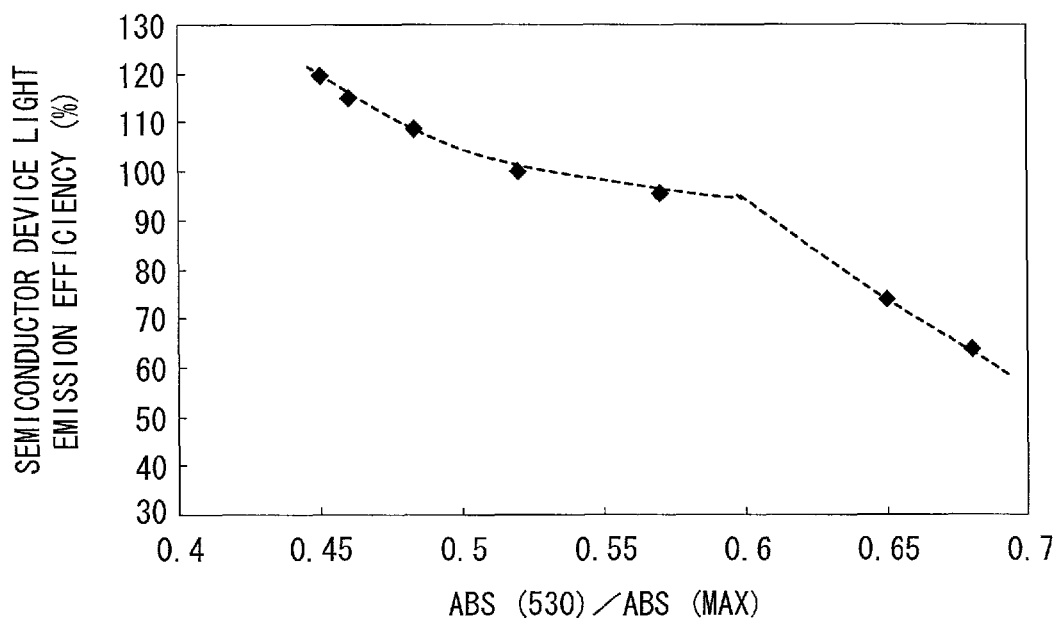
FIG. 34 is a graph representing a relation between a light emission efficiency of a semiconductor device and ABS (530)/ABS(MAX) of an orange phosphor.

FIG. 34 shows a graph illustrating a relationship between light emission efficiency and ABS(530)/ABS(MAX)ABS(530) of the orange phosphor, for each of the semiconductor devices fabricated and the semiconductor devices of Examples 1 and 3.

As shown in FIG. 34, it was confirmed that the light emission efficiency of the semiconductor devices suddenly decreased once the ABS(530)/ABS(MAX)ABS(530) of the orange phosphor becomes equal to or higher than 0.60.

The embodiments and examples disclosed in this specification should be considered as merely an exemplification for all points therein and is not limiting in any matter. The scope of the present invention is provided not in the description provided above but in the claims, and intends to include any equivalents and any and all modifications to the claims.

A semiconductor light-emitting element of the present invention has high light emission efficiency, and emits light of an incandescent lamp color which exhibit a high Ra and R9. Hence, it is possible to suitably use the present invention in various illuminations such as household illumination, medical illuminations, illuminations for vehicles and the like.

The invention claimed is:

1. A semiconductor light-emitting device that emits white light in an incandescent bulb color range, comprising:
   a semiconductor light-emitting element that emits blue light;
   a green phosphor that absorbs the blue light and emits green light; and
   an orange phosphor that absorbs the blue light and emits orange light, the orange phosphor producing an emission spectrum having a peak at a wavelength of equal to or greater than 590 nm but equal to or less than 630 nm, and having a full width at half maximum of 130 nm or greater at the peak,
   the full width at half maximum of the emission spectrum of the orange phosphor being broader than a full width at half maximum of an emission spectrum of the green phosphor,
   the orange phosphor exhibiting an absorptance having a peak wavelength of 420 nm or greater,
   ABS(530) and ABS(MAX) satisfying the following relation:
   ABS(530) ABS(MAX) <0.60, where ABS(MAX) is an absorptance of the orange phosphor at the peak wavelength of the absorptance, and ABS(530) is an absorptance of the orange phosphor at a wavelength of 530 nm.

2. The semiconductor light-emitting device as set forth in claim 1, wherein the full width at half maximum of the emission spectrum of the green phosphor is equal to or less than 70 nm.

TABLE 7

|  | Orange phosphor | Green phosphor | Resin/phosphor weight ratio | Green phosphor/orange phosphor weight ratio | Semiconductor light-emitting device Light efficiency (%) | PI(40)/PIMAX |
|---|---|---|---|---|---|---|
| Ex. 11 | P. Ex. 1-3-6 | P. Ex. 2-1 | 8.10 | 0.02 | 119.7 | 0.825 |
| Ex. 12 | P. Ex. 1-3-7 | P. Ex. 2-1 | 8.13 | 0.01 | 115.1 | 0.829 |
| Ex. 13 | P. Ex. 1-3-9 | P. Ex. 2-1 | 7.48 | 0.10 | 108.6 | 0.818 |
| C. Ex. 3 | P. Ex. 1-3-10 | P. Ex. 2-1 | 5.51 | 0.52 | 73.9 | 0.816 |
| C. Ex. 4 | P. Ex. 1-3-11 | P. Ex. 2-1 | 5.12 | 0.63 | 63.7 | 0.816 |

Ex.: Example
C. Ex.: Comparative Example
P. Ex.: Production Example

3. The semiconductor light-emitting device as set forth in claim 2, wherein the full width at half maximum of the emission spectrum of the green phosphor is equal to or less than 55 nm.

4. The semiconductor light-emitting device as set forth in claim 3, wherein the green phosphor is an Eu-activated β-sialon phosphor.

5. The semiconductor light-emitting device as set forth in claim 4, wherein the Eu-activated β-sialon contains oxygen in a range of 0.1% by weight to 0.6% by weight.

6. The semiconductor light-emitting device as set forth in claim 5, wherein the Eu-activated β-sialon phosphor exhibits an absorptance at 600 nm of equal to or less than 10%.

7. The semiconductor light-emitting device as set forth in claim 1, wherein the orange phosphor is a Ce-activated nitride phosphor or a Ce-activated oxynitride phosphor.

8. The semiconductor light-emitting device as set forth in claim 1, wherein the orange phosphor is a Ce-activated $CaAlSiN_3$ phosphor in a form of solid solution crystal prepared by incorporating Ce and oxygen into a crystal having a composition of $cCaAlSiN_3 \cdot (1-c)LiSi_2N_3$, where $0.2 \leq c \leq 0.8$.

9. The semiconductor light-emitting device as set forth in claim 8, wherein the solid solution crystal contains Ce in a range of 6% by weight or less.

10. The semiconductor light-emitting device as set forth in claim 1, wherein the white light emitted from the semiconductor light-emitting device has a peak wavelength of about 600 nm.

* * * * *

UNITED STATES PATENT AND TRADEMARK OFFICE
CERTIFICATE OF CORRECTION

PATENT NO. : 8,674,392 B2  
APPLICATION NO. : 13/580791  
DATED : March 18, 2014  
INVENTOR(S) : Kenichi Yoshimura et al.

Page 1 of 1

It is certified that error appears in the above-identified patent and that said Letters Patent is hereby corrected as shown below:

On the Title page, in item (73) Assignee:

Please add --Independent Administrative Institution, National Institute for Materials Science--

Signed and Sealed this  
Twenty-seventh Day of May, 2014

Michelle K. Lee  
*Deputy Director of the United States Patent and Trademark Office*